United States Patent
Tsukada

(12) 
(10) Patent No.: US 6,212,107 B1
(45) Date of Patent: Apr. 3, 2001

(54) CHARGE PUMP CIRCUIT AND A STEP-UP CIRCUIT PROVIDED WITH SAME

(75) Inventor: Shyuichi Tsukada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,858

(22) Filed: Dec. 14, 1999

(30) Foreign Application Priority Data

Dec. 15, 1998 (JP) .................................................. 10-356334

(51) Int. Cl.[7] .................................................. G11C 7/00
(52) U.S. Cl. .................................. 365/189.09; 365/189.11; 365/226; 327/536
(58) Field of Search ........................ 365/189.09, 189.11, 365/226; 327/536, 534, 537

(56) References Cited

U.S. PATENT DOCUMENTS 5,138,190 * 8/1992 Yamazaki et al. ............... 365/189.11
5,841,725 * 11/1998 Kang et al. ........................... 365/226
5,978,283 * 11/1999 Hsu et al. ........................ 365/189.09
6,055,193 * 4/2000 Manning et al. ................ 365/189.11

FOREIGN PATENT DOCUMENTS 6-14529   1/1994  (JP) .
6-140889  5/1994  (JP) .
6-153493  5/1994  (JP) .
8-294267  11/1996 (JP) .

* cited by examiner

Primary Examiner—Tan T. Nguyen
(74) Attorney, Agent, or Firm—McGinn & Gibb, PLLC

(57) ABSTRACT

The invention relates to a charge pump circuit that carries out multiple-voltage rectification using a first clock, a second clock, and a third clock and outputs a stepped-up voltage, the charge pump circuit having a construction that includes a leak current suppressing circuit that outputs a third clock at amplitude of the stepped-up voltage during normal operation and outputs a third clock at amplitude of an external power supply voltage or less during a burn-in test, whereby a leak current does not flow at the junction portions of transistors and transistors do not break down due to overvoltage even during a burn-in test.

20 Claims, 14 Drawing Sheets

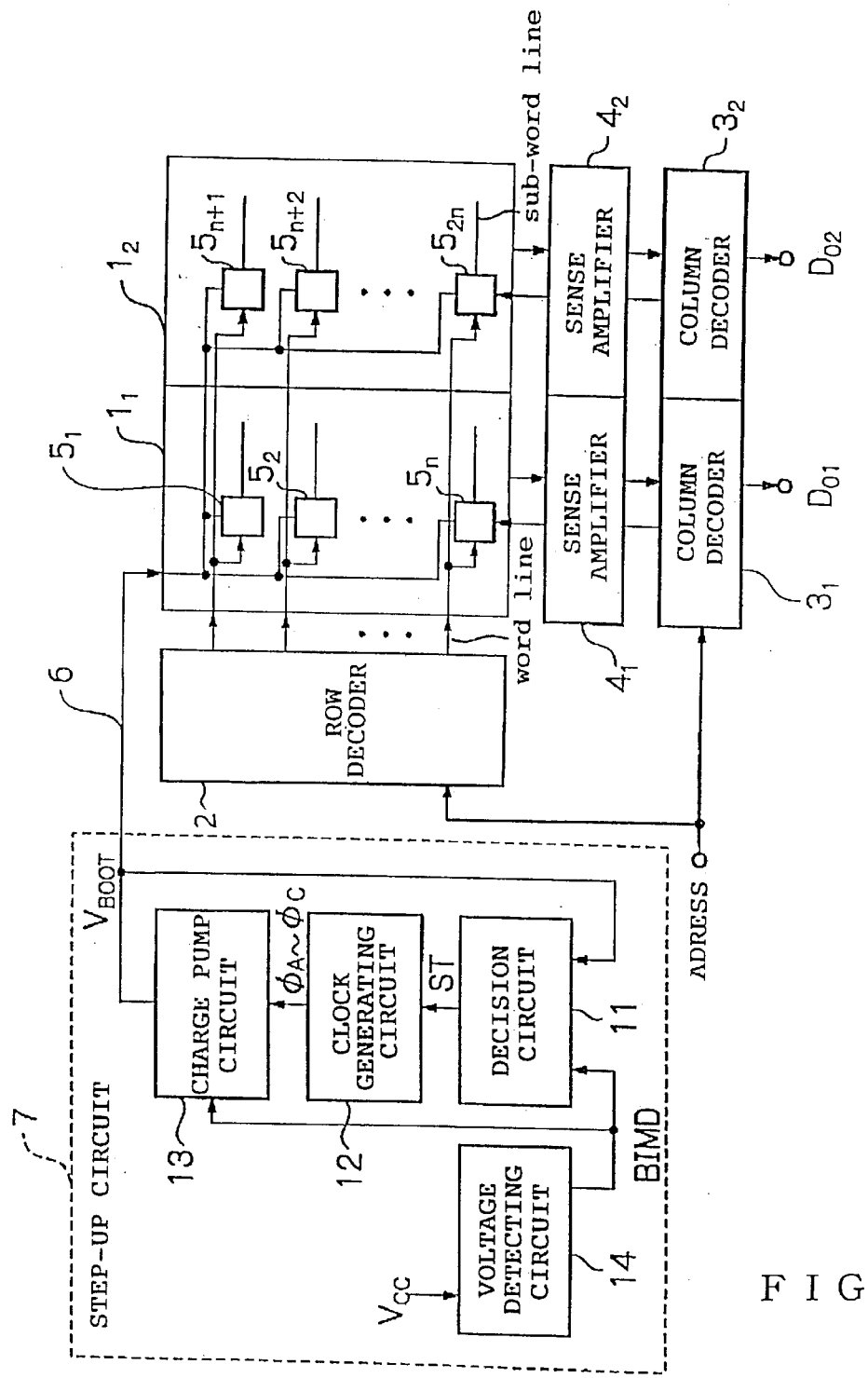
F I G. 4

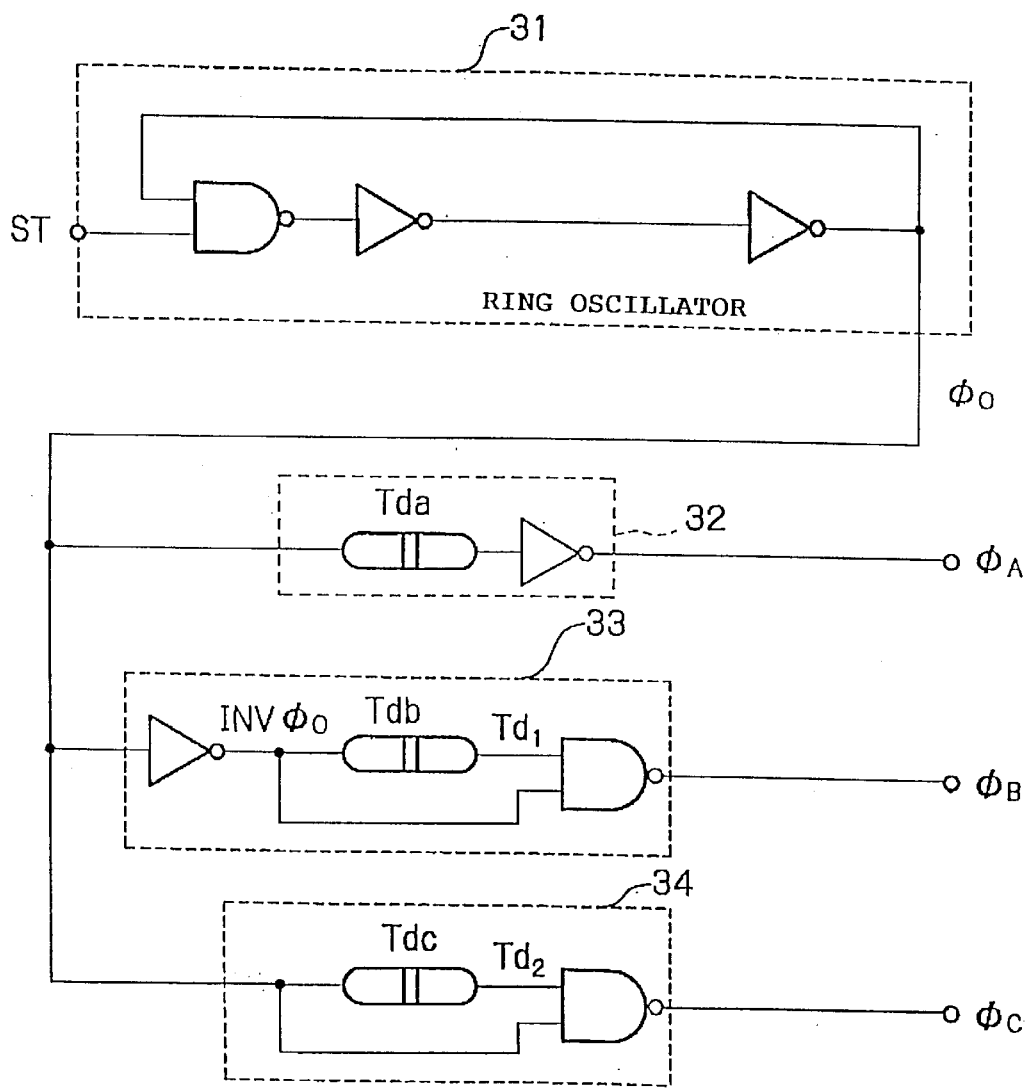
F I G. 6

CHARGE PUMP CIRCUIT AND A STEP-UP CIRCUIT PROVIDED WITH SAME

BACKGROUND OF THE INVENTION

1. Field of the Invention

The present invention relates to a step-up circuit for stepping up an external power supply voltage that is supplied from outside, and particularly to a charge pump circuit that generates a stepped-up voltage that is applied to the word lines of a semiconductor memory device, and to a step-up circuit that is provided with such a charge pump circuit.

2. Description of the Related Art

In recent years, semiconductor integrated circuit devices such as semiconductor memory devices do not only use external power supply voltage $V_{CC}$ supplied from outside as is, but rather, in the interest of promoting low power consumption and improving element reliability, step down or step up voltage to generate a prescribed internal power supply voltage which is then supplied to each of the necessary internal circuits.

As a semiconductor integrated circuit device with necessitating this type of internal power supply voltage, DRAM (Dynamic Random Access Memory), for example, typically has a configuration that includes a storage capacitor that stores information by storing a signal charge in a memory cell and a switching transistor for controlling the storage/discharge of the signal charge in the storage capacitor, an n-channel MOS field effect transistor (hereinbelow referred to as a "NMOS transistor") being used as the switching transistor.

The switching transistor has its drain connected to a bit line, its gate connected to a word line, and its source connected to ground by way of the storage capacitor, and the transistor cannot be turned ON unless a voltage is applied to the gate that is higher than the source voltage by a threshold voltage $V_{TH}$. The source voltage normally varies between 0 and $V_{CC}$, so a voltage of at least $(V_{CC}+V_{TH})$ must be applied to the gate to turn ON the switching transistor. A step-up circuit that steps up the external power supply voltage $V_{CC}$ generates a stepped-up voltage that is applied to the gate (word line) of the switching transistor.

The voltage endurance of transistors used in semiconductor integrated devices in recent years, however, has tended to decrease with miniaturization. The power supply voltage must consequently be decreased, but in the interest of providing a power supply that is shared with other logic circuits composed of TTL (Transistor-Transistor Logic), a configuration is adopted in which an external power supply voltage $V_{CC}$ is stepped down by a step-down power supply circuit provided inside the chip, this stepped-down voltage then being supplied to the necessary internal circuits.

For example, if external power supply voltage $V_{CC}$ is made 5 V, the internal power supply voltage that is supplied to internal circuits requiring a stepped-down voltage is stepped down to 3.3 V by a step-down power supply circuit. Despite miniaturization of the transistor size, the threshold voltage $V_{TH}$ of transistors is not necessarily scaled down as is the power supply voltage.

In semiconductor integrated circuit devices, burn-in tests are commonly carried out after fabrication to eliminate initial defects. In a burn-in test, a voltage that is higher than the normal external power supply voltage $V_{CC}$ is applied to the semiconductor integrated circuit that is under test. In DRAM, the substrate is biased to a negative voltage to improve charge-holding characteristics, and in such a case, a voltage which is the sum of the negative voltage to the substrate added to the step-up voltage is applied to transistors used in the step-up circuit. Breakdown may occur when a voltage that exceeds the junction voltage endurance is applied.

In Japanese Patent Laid-open No. 140889/94 (hereinbelow referred to as "the first example of the prior art"), a semiconductor device is proposed that is provided with a clamping circuit that clamps the stepped-up voltage and a clamping control means for allowing change of this clamped voltage, thereby preventing junction breakdown of transistors within the step-up circuit by changing the clamped voltage used during normal operation and during a burn-in test.

In the semiconductor device described in the first example of the prior art, the step-up circuit is caused to operate only when high voltage is necessary (for example, during memory access), and when high voltage is not necessary, the output of the step-up circuit is connected to a ground potential line by the clamping circuit, whereby the voltage of the stepped-up voltage line for supplying stepped-up voltage to internal circuits is made to equal the ground potential.

Since parasitic capacitance is present in a stepped-up voltage line of this type of configuration, the step-up circuit charges the parasitic capacitance of the stepped-up voltage line each time the memory is accessed, and the electric charge of the parasitic capacitance of the stepped-up voltage lines that has been stored must then be discharged each time access is completed. In particular, stepped-up voltage lines have become longer with the increase in memory capacitance in semiconductor memory devices of recent years, thereby resulting in a trend toward an even greater parasitic capacitance and a consequent increase in the current consumed by a step-up circuit.

In addition, because the charge that has been stored in the parasitic capacitance of the stepped-up voltage lines is discharged by the clamping circuit, the loss current by the clamping circuit results in greater consumption of current by the step-up circuit. The high current consumption of the step-up circuit of the first example of the prior art as described hereinabove necessitates transistors having high current supply capabilities, and a greater loss current therefore flows to the clamping circuit than in the second example of the prior art, to be described hereinbelow.

When accessing memory, the charging of the stepped-up voltage lines when the step-up circuit is first operated lengthens the time for the voltage of the word lines that are connected to the stepped-up voltage lines to reach a prescribed value, and the speed of reading and writing information therefore drops. In order to make the voltage of the stepped-up voltage lines reach the prescribed value in a shorter time, the capacitance of a step-up capacitor should be made greater than the parasitic capacitance of the stepped-up voltage lines. When the capacitance of the capacitor is increased, however, the chip area also increased.

To solve the above-described problem of the first example of the prior art, Japanese Patent Laid-open No. 153493/94 (hereinbelow referred to as the "second example of the prior art) proposes a configuration in which a stepped-up voltage is always outputted and a control circuit turns the connection of the step-up circuit output and word lines ON and OFF.

Since the stepped-up voltage lines are always charged in the configuration of the second example of the prior art, the consumption of power that accompanies the charge and discharge of the stepped-up voltage lines can be suppressed and the rise time of the voltage of the word lines is not delayed. In addition, the chip area is not increased because there is no need to increase the capacitance of the step-up capacitor.

In addition, the provision of a limiting circuit for limiting the stepped-up voltage and a step-up clock voltage control circuit for limiting the output amplitude of a clock driver for driving a step-up clock in the second example of the prior art allows a decrease in the power consumption of the step-up circuit that includes a limiting circuit.

Nevertheless, the use of MOS transistors having drains and gates connected together as a diode for rectifying the step-up clock in the second example of the prior art results in the problems of large voltage drops due to the diode, poor rectifying efficiency, and inability to obtain the desired step-up voltage.

Japanese Patent Laid-open No. 14529/94 (hereinbelow referred to as the "third example of the prior art") proposes a step-up circuit that improves rectifying efficiency by not connecting transistors as diodes as in the second example of the prior art, but rather, by switch-operating the transistors as shown in FIG. 1.

In FIG. 1, the charge pump circuit of the step-up circuit of the third example of the prior art carries out multiple-voltage rectification by clocks $\phi_A$, $\phi_B$, and $\phi_C$ and generates a stepped-up voltage, and includes: first inverter 101 that inverts clock $\phi_A$ composed of a prescribed cycle and outputs the result at amplitude of external power supply voltage $V_{CC}$; second inverter 102 that inverts clock $\phi_B$ composed of a prescribed cycle and outputs the result at amplitude of external power supply voltage $V_{CC}$; third inverter 103 that inverts clock $\phi_C$ composed of a prescribed cycle and outputs the result at amplitude of stepped-up voltage $V_{BOOT}$; step-up capacitors C1, C2, and C3 that are connected to the output ends of first through third inverters 101–103, respectively; NMOS transistor Q1 that receives the output clock of step-up capacitor C1, turns ON and OFF in accordance with the output clock of step-up capacitor C3, and outputs stepped-up voltage $V_{BOOT}$ that is higher than external power supply voltage $V_{CC}$ that is supplied from outside; NMOS transistor Q2 for biasing the output voltage of step-up capacitor C1 by external power supply voltage $V_{CC}$ and that turns ON and OFF in accordance with the output clock of step-up capacitor C2; NMOS transistor Q3 for biasing the output voltage of step-up capacitor C3 by external power supply voltage $V_{CC}$ and that turns ON and OFF in accordance with the output clock of step-up capacitor C2; and NMOS transistor Q4 for biasing the output voltage of step-up capacitor C2 by external power supply voltage $V_{CC}$ and that turns ON and OFF in accordance with the output clock of step-up capacitor C3. First inverter 101 is made up by p-channel transistor P1 and n-channel transistor N1, second inverter 102 by p-channel transistor P2 and n-channel transistor N2, and third inverter 103 by p-channel transistor P3 and n-channel transistor N3. The block made up by transistors Q1 and Q2 and step-up capacitor C1 is step-up section 111, and the block made up of transistors Q3 and Q4 and step-up capacitors C2 and C3 is step-up control unit 112.

The operation of the charge pump circuit of the third example of the prior art shown in FIG. 1 is next explained using FIG. 2 and FIG. 3. FIG. 3 shows the maximum voltages generated at nodes A, B, and C with respect to changes in the external power supply voltage of the charge pump circuit shown in FIG. 1, and voltage $V_{BOOT}$ of node D shows the set value. Voltage $V_{BOOT}$ of node D is smoothed by a load capacitance (not shown in the figures) and controlled by a judging circuit (not shown) to equal the set value, and voltage $V_{BOOT}$ is therefore maintained at substantially the set value voltage when the power supply voltage is greater than voltage $V_1$. In addition, although the duty ratios of clocks $\phi_B$ and $\phi_C$ are described as being 50% (i.e., clocks $\phi_B$ and $\phi_C$ rise and fall simultaneously with the rise and fall of clock $\phi_A$) in the following explanation, in actual practice, the duty ratios of clocks $\phi_B$ and $\phi_C$ are set to 50% or less to prevent short-circuit currents.

First, as shown in FIG. 2, when clocks $\phi_A$ and $\phi_C$ are at high level and clock $\phi_B$ is at low level at time $t_0$, the outputs of first inverter 101 and third inverter 103 become low level and the output of second inverter 102 becomes high level. At this time, transistors Q2, Q3, N1, P1, and N3 each turn ON, and transistors Q1, Q4, P1, N2, and P3 each turn OFF.

The high-level output voltage of second inverter 102 is thus added to capacitor C2 that was charged by the power supply voltage (hereinbelow referred to as "$V_{CC}$") and the voltage of node B becomes $2V_{CC}$. The voltage of node A drops for an instant because the first inverter 101 end of capacitor C1 is discharged to a low level, but when the voltage of node B $2V_{CC}$ is supplied to the gate of transistor Q2, transistor Q2 turns ON and node A is gradually charged to $V_{CC}$.

In the same way, transistors Q3 and N3 each turn ON, which causes the node C side of capacitor C3 to be charged to stepped-up voltage $V_{BOOT}$, which is the output of the charge pump circuit, and the other end of capacitor C3 is discharged to the ground potential.

Next, at time $t_1$, clocks $\phi_A$ and $\phi_C$ switch to low level and clock $\phi_B$ switches to high level, whereupon the outputs of first inverter 101 and third inverter 103 become high level and the output of second inverter 102 becomes low level. At this time, transistors Q2, Q3, N1, P1, and N3 each turn OFF, and transistors Q1, Q4, P1, N2, and P3 each turn ON.

Accordingly, the high-level output voltage of inverter 103 is added to capacitor C3, which was charged to $V_{BOOT}$, and the voltage of node C becomes $V_{CC}+V_{BOOT}$. In addition, the voltage of node A becomes $2V_{CC}$ because the first inverter 101 end of capacitor C1 is charged to $V_{CC}$, and this $V_{CC}$ is added to the voltage of node A, which was $V_{CC}$ until this point. When the voltage of node C becomes $V_{CC}+V_{BOOT}$ and this voltage is supplied to the gate of transistor Q1, transistor Q1 turns ON and $2V_{CC}$ is outputted from node D as stepped-up voltage $V_{BOOT}$.

Next, the charge that was stored in capacitor C1 is discharged and the voltage of node A gradually drops from $2V_{CC}$, whereupon transistors Q4 and N2 turn ON, causing the node B side of capacitor C2 to be charged to $V_{CC}$ and the other end to be discharged to the ground potential. The operation of times $t_0$ and $t_1$ are subsequently repeated in the same way, and the stepped-up voltage $V_{BOOT}$ continues to be outputted from the charge pump circuit.

The stepped-up voltage $V_{BOOT}$ is supplied to the source of the p-channel transistor of third inverter 103 for the following reason.

Transistor Q1 is an NMOS transistor, the drain of which is connected to node A, and a voltage stepped-up to $2V_{CC}$ is supplied at time $t_1$. If $2V_{CC}$ is supplied to the gate of transistor Q1 and transistor Q1 is turned ON, the source voltage is normally lower than the gate voltage by just the threshold voltage $V_{TH}$. A stepped-up voltage of $2V_{CC}-V_{TH}$ is therefore outputted from the source of transistor Q1, and the step-up efficiency is decreased by the occurrence of the threshold voltage $V_{TH}$ loss. To decrease this type of loss, the voltage supplied to the gate of transistor Q1 should be a voltage of at least $2V_{CC}+V_{TH}$, and this voltage is generated in the third example of the prior art by supplying stepped-up voltage $V_{BOOT}$ to third inverter 103.

As shown in FIG. 2, in the charge pump circuit according to the third example of the prior art, a voltage of $2V_{CC}$ is supplied to the source or drain of NMOS transistor Q1 that is connected to node A and the gate of NMOS transistor Q2 that is connected to node B, and a voltage of $(V_{CC}+V_{BOOT})$ is supplied to the gate of NMOS transistor Q1 that is connected to node C.

In the charge pump circuit according to the third example of the prior art, when the power supply voltage $V_{CC}$ increases, nodes A and B also increase proportionally, as shown in FIG. 3. In contrast, node D increases in proportion to $V_{CC}$ until power supply voltage $V_{CC}$ reaches $V_1$ but then remains constant when power supply voltage $V_{CC}$ is within the range $V_1-V_2$. This constant value for node D is obtained because the semiconductor integrated circuit is being used within the range of power supply voltage $V_1-V_2$ (hereinbelow referred to as "normal operating voltage"), and within this normal operating voltage, stepped-up voltage $V_{BOOT}$ is controlled to a constant by a stabilizing means (not shown in the figures) such that the performance of the semiconductor integrated circuit is not dependent on fluctuations in the power supply voltage. When the power supply voltage exceeds $V_2$, the stabilizing means uses a voltage that is resistance-divided from power supply voltage $V_{CC}$ as a control reference voltage, and node D again increases in proportion to $V_{CC}$, although with a more gradual inclination than the inclination up to $V_1$. Variation at node C also changes in accordance with the change at node D.

Stepped-up voltage $V_{BOOT}$ is thus suppressed to a prescribed range at a normal operating voltage, but accelerated tests, such as in burn-in tests, are commonly performed in which a voltage higher than the normal operating voltage is supplied to internal circuits to quickly and efficiently eliminate initial defects.

As described hereinabove, there has been a trend in recent years for the voltage endurance of transistors used in semiconductor integrated circuits to decrease with miniaturization, and when a voltage of $2V_{CC}$ or $V_{BOOT}+V_{CC}$ is applied to the source or drain of a transistor, a leak current flows from the diffusion layer of the source or drain to the semiconductor substrate or well region, and in a worst case, breakdown occurs in the junction area of the diffusion layer.

In a case in which a charge pump circuit such as shown in FIG. 1 is constructed of transistors having a semiconductor substrate potential of 0 V and a junction voltage endurance of 10 V, for example, if the normal operating voltage $V_2$ is 3.6 V and the stabilized stepped-up voltage $V_{BOOT}$ is 4.5 V, nodes A and B will experience a maximum voltage of 7.2 V and node C will experience a maximum voltage of 8.1 V. The voltage will thus remain within the junction voltage endurance of the transistor during normal operation and the semiconductor integrated circuit will operate without problem.

If a voltage of 5 V is supplied as the external power supply voltage $V_{CC}$ during a burn-in test, however, a voltage of 10 V+α will be supplied to the drain of NMOS transistor Q3 that is connected to node C, a leak current will flow from the transistor drain toward the substrate, and breakdown will occur in the junction region of the diffusion layer.

The well region is generally biased to about −1.5 V to prevent the loss of a signal charge stored in the capacitor of a memory cell region due to, for example, noise. In a semiconductor memory device in which manufacturing steps have been reduced by eliminating well regions, memory cell regions and peripheral circuit regions are formed in the same well regions, and the voltage of these well regions, moreover, is set to the same level. A voltage of 11.5 V is therefore applied to the drain of NMOS transistor Q4 that is connected to node B and a voltage of 11.5 V+α is applied to the drain of NMOS transistor Q3 that is connected to node C, thus increasing the possibility of the occurrence of a leak current and the destruction of the junction portion.

Even though the breakdown may not occur in the junction portion, the flow of a leak current between the semiconductor substrate and the source or drain of a transistor causes the voltage of the well region to rise. Since the sources and drains of transistors provided in the memory cell region are biased in the forward direction with respect to the voltage of the well region, the signal charge stored in storage capacitors is instantly discharged and the stored information vanishes.

Although these problems can be solved by raising the junction voltage endurance of the transistor, the impurity concentration of the diffusion layer that makes up the source and drain must be made lower than in other transistors, and this necessitates the preparation of separate masks and additional processes. These additional masks and procedures raise the costs of the semiconductor integrated circuit. In addition, the size of the transistor increases, and this also raises chip area and the base cost of the chip.

SUMMARY OF THE INVENTION

It is an object of the present invention to provide a charge pump circuit having a high rectifying efficiency that can obtain a large current at high voltage without employing transistors having high voltage endurance and that can generate an internal voltage that is higher than the normal operating voltage during a burn-in test, and in addition, a step-up circuit that is provided with such a charge pump circuit.

It is another object of the present invention to provide a charge pump circuit that, even when composed of transistors that are produced in the same step as memory cell regions, suppresses the occurrence of leak currents at junctions and eliminates the loss of data that are stored in memory cells during a burn-in test, and in addition, a step-up circuit that uses such a charge pump circuit.

To achieve the above-described objects, a charge pump circuit according to the present invention is a construction that carries out multiple-voltage rectification using a first clock, a second clock, and a third clock and that outputs a stepped-up voltage; and that is provided with a leak current suppressing circuit that outputs the third clock at amplitude of the stepped-up voltage during normal operation and outputs the third clock at amplitude of an external power supply voltage or less during a burn-in test.

The charge pump circuit of the present invention is provided with: a first leak current suppressing circuit that outputs a first clock at amplitude of the external power supply voltage during normal operation and outputs a first clock at a prescribed amplitude that is lower than the external power supply voltage during a burn-in test; a second leak current suppressing circuit that outputs a second clock at amplitude of the external power supply voltage during normal operation and outputs a second clock at a prescribed amplitude that is lower than the external power supply voltage during a burn-in test; and a third leak current suppressing circuit that outputs a third clock at amplitude of the stepped-up voltage during normal operation and outputs a third clock at a prescribed amplitude that is lower than the stepped-up voltage during a burn-in test.

In a charge pump circuit that is configured in this way, the voltage that is applied to the diffusion layer of transistors, which are the constituent elements, can be suppressed to within the junction voltage endurance even when the external power supply voltage becomes high during a burn-in test.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 4 is a block diagram showing the configuration of a semiconductor memory device provided with the step-up circuit of the present invention;

FIG. 6 is a circuit diagram showing one embodiment of the clock generating circuit belonging to the step-up circuit shown in FIG. 4;

DETAILED DESCRIPTION OF THE PREFERRED EMBODIMENTS

First Embodiment

Figure 1:
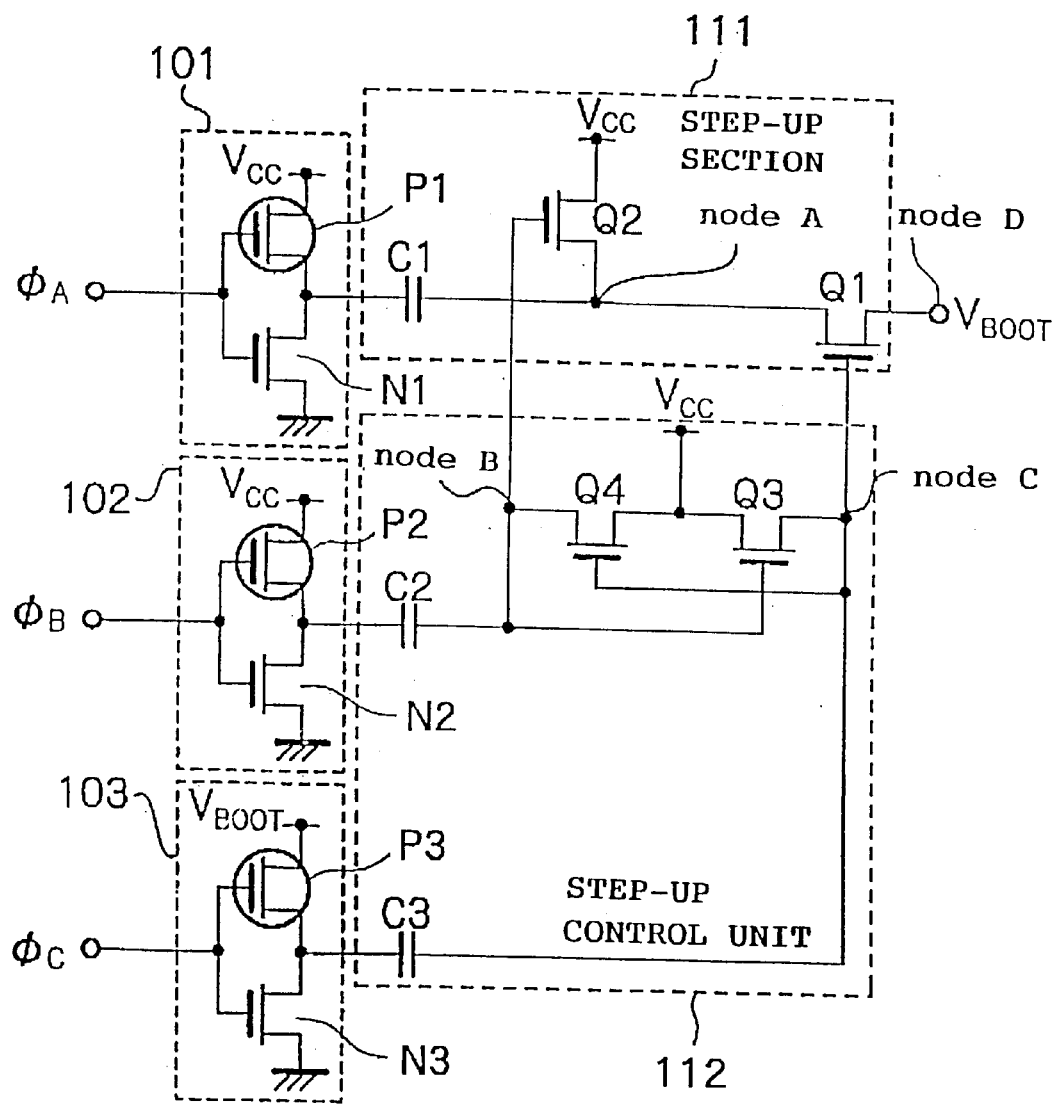
FIG. 1 is a circuit diagram showing the configuration of a charge pump circuit having a step-up circuit of the prior art.
Figure 2:
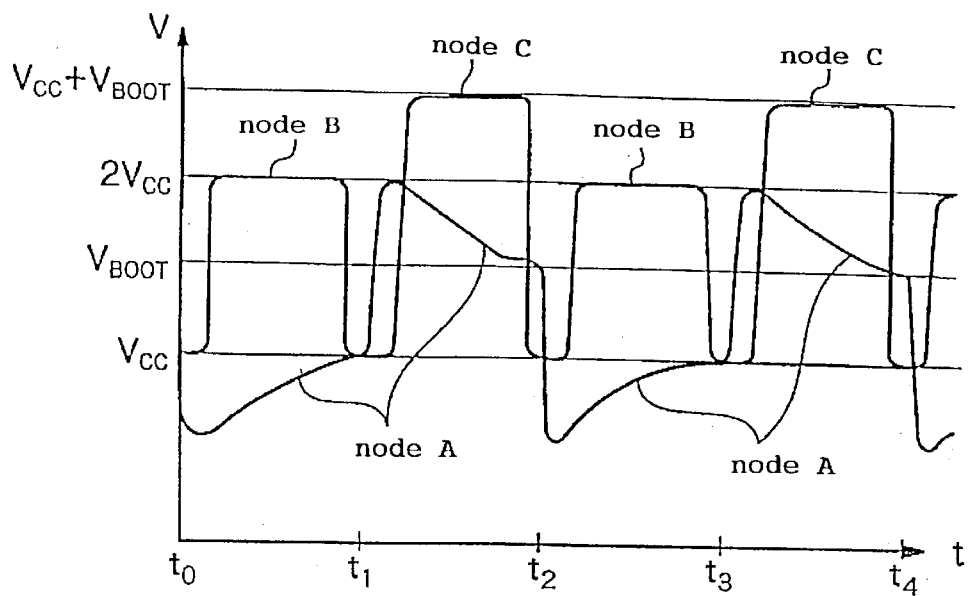
FIG. 2 is a waveform chart showing the voltage waveform that occurs at each node of the charge pump circuit shown in FIG. 1.
Figure 3:
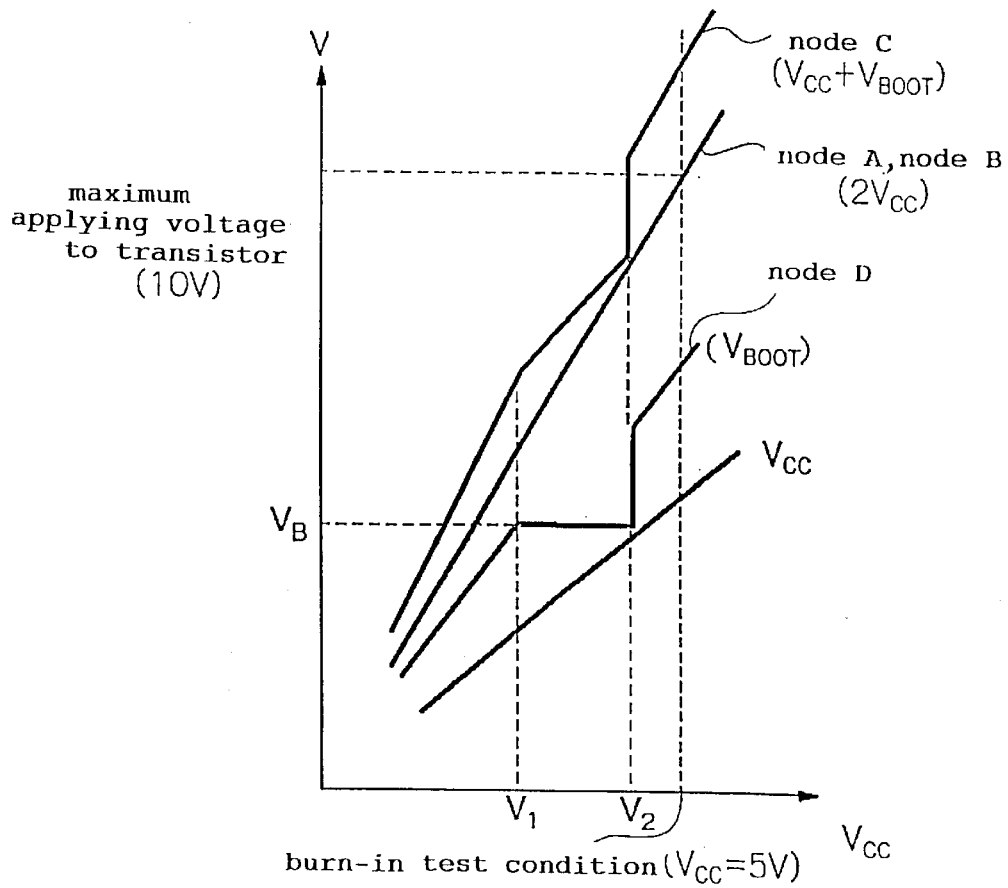
FIG. 3 is a graph showing the relation of the maximum voltage occurring at each node to change in the external power supply voltage of the charge pump circuit shown in FIG. 1.

The first embodiment of the present invention is first explained using the accompanying figures.

As shown in FIG. 4, the semiconductor memory device according to the first embodiment is a construction including: memory cell regions $1_1$ and $1_2$ made up of a plurality of memory cells for storing information; row decoder 2 for decoding addresses received from outside and outputting row-direction (the horizontal direction in FIG. 4) word-line selection signals for specifying memory cells to be accessed (memory cells which data are to be read from or written to); column decoders $3_1$ and $3_2$ for decoding addresses received from outside and outputting column-direction (the vertical direction in FIG. 4) bit-line selection signals for specifying memory cells that are to be accessed; sense amplifiers $4_1$ and $4_2$ for reading information recorded in memory cells; word line selection circuits $5_1$–$5_{2n}$ (n being a positive number) provided corresponding to each memory cell for selecting subword lines that are to be accessed according to word-line selection signals outputted from row decoder 2; and step-up circuit 7 for supplying stepped-up voltage $V_{BOOT}$ to each of word-line selection circuits $5_1$–$5_{2n}$ by way of stepped-up voltage line 6.

Word-line selection circuits $5_1$–$5_{2n}$ are each connected to one subword line, and a plurality of memory cells are connected to each subword line. Word-line selection circuits $5_1$–$5_{2n}$ supply stepped-up voltage $V_{BOOT}$ to one subword line in one memory cell region when the outputs of row decoder 2 and a column decoder 3 are activated at the same time. The plurality of memory cells that are supplied with stepped-up voltage $V_{BOOT}$ output stored data to sense amplifiers 4 and store data that are supplied from sense amplifiers 4. Column decoders 3 select one of the plurality of sense amplifiers 4 and receive and output stored data. FIG. 4 shows the construction for a case in which there are two memory cell regions, but the number of memory cell regions may also be one, three, or more. In such cases, a sense amplifier and column decoder are provided for each memory cell region.

Step-up circuit 7 is a construction having: a feedback loop made up of a decision circuit 11, clock generating circuit 12, and charge pump circuit 13; and voltage detecting circuit 14 that detects the voltage of the external power supply voltage $V_{CC}$.

Decision circuit 11 is a circuit for deciding whether or not stepped-up voltage $V_{BOOT}$ is higher than a prescribed set voltage that is generated based on reference voltage $V_{REF}$, transmits a signal as status signal ST for halting the oscillation of clock generating circuit 12 if $V_{BOOT}$ is greater than the set voltage. Alternatively, decision circuit 11 transmits a signal for continuing the oscillation of clock generating circuit 12 as status signal ST if $V_{BOOT}$ is equal to or lower than the set voltage.

Clock generating circuit 12 generates clocks $\phi_A$, $\phi_B$, and $\phi_C$ in accordance with the status signals ST outputted from decision circuit 11 and outputs each of these clocks to charge pump circuit 13.

Charge pump circuit 13 carries out multiple-voltage rectification using the clocks $\phi_A$, $\phi_B$, and $\phi_C$ outputted from clock generating circuit 12 and generates stepped-up voltage $V_{BOOT}$.

Stepped-up voltage $V_{BOOT}$ is compared with the set voltage (hereinbelow referred to as "set level") at decision circuit 11 and is strictly controlled to equal the set voltage. Clock generating circuit 12 repeatedly halts the supply of clocks $\phi_A$–$\phi_C$ if stepped-up voltage $V_{BOOT}$ becomes higher than the set level and resumes the supply of clocks $\phi_A$–$\phi_C$ if it becomes lower. The value of stepped-up voltage $V_{BOOT}$ fluctuates within the range set value ±0.1 V, and stepped-up voltage $V_{BOOT}$ is therefore always approximately at the set level. The voltage of stepped-up voltage $V_{BOOT}$ is thus dependent not on amplitude of clocks $\phi_A$–$\phi_C$ supplied from clock generating circuit 12 but on the interval at which clocks $\phi_A$–$\phi_C$ are supplied.

An extremely large load capacitance (not shown in the figure) attaches to the node that outputs stepped-up voltage $V_{BOOT}$. This state comes about because stepped-up voltage $V_{BOOT}$ is supplied to a large number of word line selection circuits $5_1$–$5_{2n}$, and when the wiring and nodes within word line selection circuits $5_1$–$5_{2n}$ attain the stepped-up voltage $V_{BOOT}$ level, for example, when the outputs of inverters supplied with stepped-up voltage $V_{BOOT}$, become high level (the $V_{BOOT}$ level), the capacitance of these inverter outputs all becomes the parasitic capacitance of node D. In addition, a capacitor may be added to node D as compensating capacitance to make the load capacitance even greater.

In this embodiment, the load capacitance, which is the sum of the above-described parasitic capacitance and compensating capacitance, is approximately 2000 pF. The voltage increase of stepped-up voltage $V_{BOOT}$ is therefore minimal (on the order of 0.05 V) even if clocks $\phi_A$–$\phi_C$ applied to charge pump circuit 13 are advanced one cycle. However, since the speed of determination of decision circuit 11 is approximately equivalent to the time interval of one clock cycle, and the time interval from the time stepped-up voltage $V_{BOOT}$ becomes higher than the set level until the clock is halted is about one clock, stepped-up voltage $V_{BOOT}$ does not exceed set value+0.1 V.

Although the current of stepped-up voltage $V_{BOOT}$ flows to word-line selection circuits $5_1$–$5_{2n}$ connected to step-up circuit 7, stepped-up voltage $V_{BOOT}$ only drops to approximately set value–0.1 V due to the presence of the large load capacitance, and clock generating circuit 12 soon operates to return stepped-up voltage $V_{BOOT}$ to the set value.

Voltage detecting circuit 14 senses the voltage of external power supply voltage $V_{CC}$ that is supplied from outside, and when external power supply voltage $V_{CC}$ reaches or exceeds a prescribed power supply voltage or when a setting signal instructing the execution of a burn-in test is received by way of an external terminal (not shown in the figures), voltage detecting circuit 14 sets a burn-in mode signal BIMD, which is a signal for switching to the burn-in test mode, to a high level.

When the burn-in mode signal BIMD is at a low level, decision circuit 11 and charge pump circuit 13 of step-up circuit 7 shown in FIG. 4 carry out the above-described normal operation and within the range of the operating power supply voltage ($V_1$–$V_2$), control stepped-up voltage $V_{BOOT}$ to a fixed value.

When the burn-in mode signal BIMD becomes high level, however, decision circuit 11 compares stepped-up voltage $V_{BOOT}$ with a prescribed set voltage that is generated based on external power supply voltage $V_{CC}$. Charge pump circuit 13 limits amplitude of clocks outputted from the step-up capacitor and operates so as to suppress the voltage of the source or drain of transistors to below the junction voltage endurance.

Each of the constituent elements of the step-up circuit shown in FIG. 4 is next described in detail.

Figure 5:
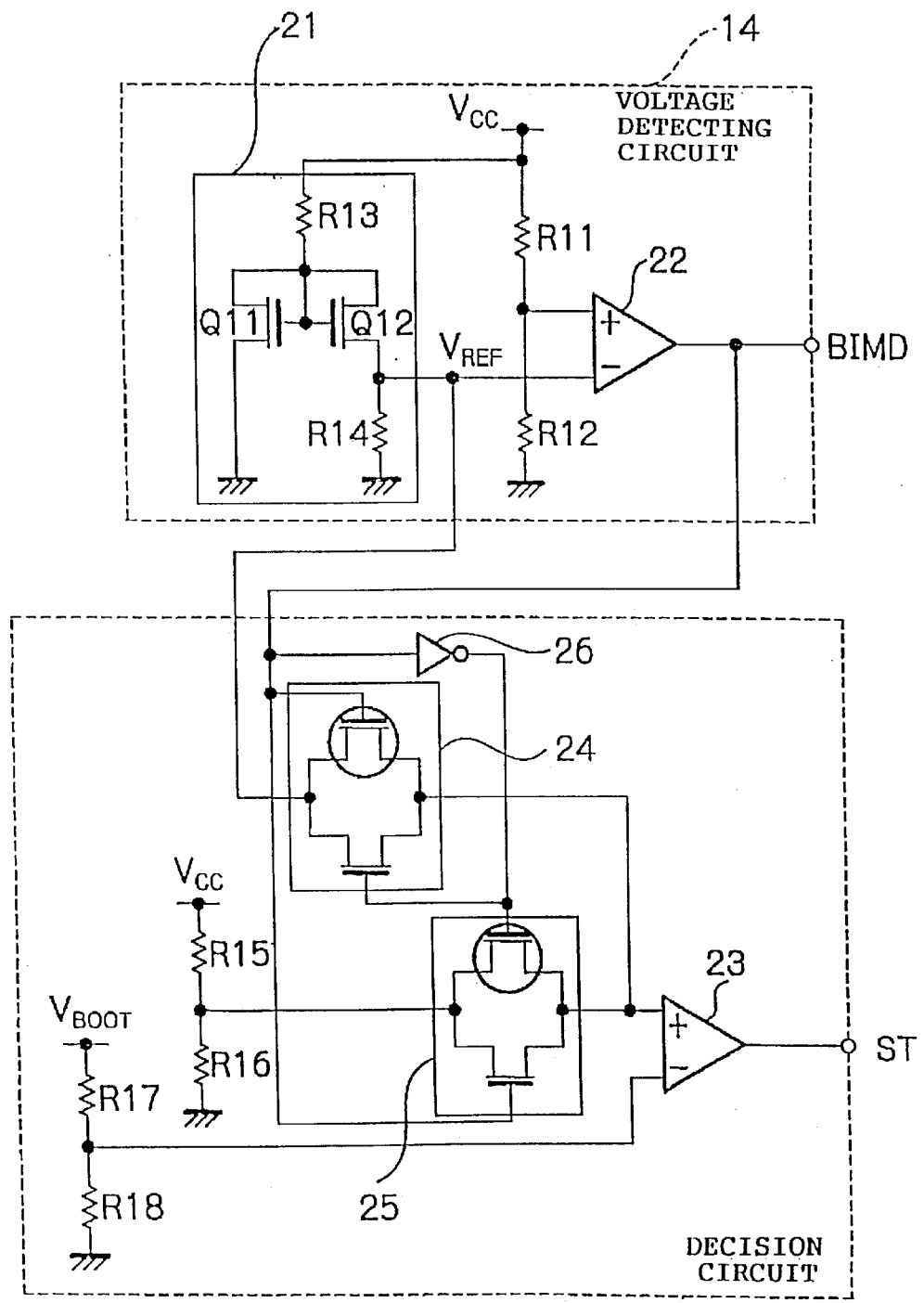
FIG. 5 is a circuit diagram showing one embodiment of a voltage detecting circuit and decision circuit belonging to the step-up circuit shown in FIG. 4.

As shown in FIG. 5, voltage detecting circuit 14 is made up of reference voltage generating circuit 21 for outputting a prescribed reference voltage $V_{REF}$, and first comparator 22 for comparing reference voltage $V_{REF}$ with a voltage that is external power supply voltage $V_{CC}$ divided by resistors R11 and R12 and outputting burn-in mode signal BIMD based on the comparison results.

Reference voltage generating circuit 21 is made up of: NMOS transistor Q11 having gate and drain connected in common and to which external power supply voltage $V_{CC}$ is applied by way of resistor R13; NMOS transistor Q12 having its gate and drain also connected in common to the gate and drain of NMOS transistor Q11; and load resistor R14 inserted between the source of NMOS transistor Q12 and the ground potential for outputting reference voltage $V_{REF}$.

Decision circuit 11 is made up of: second comparator 23 for comparing reference voltage $V_{REF}$ and stepped-up voltage $V_{BOOT}$, or external power supply voltage $V_{CC}$ and stepped-up voltage $V_{BOOT}$ at a prescribed ratio and outputting the comparison results as status signal ST; resistors R15 and R16 for dividing external power supply voltage $V_{CC}$ at a prescribed ratio; resistors R17 and R18 for dividing stepped-up voltage $V_{BOOT}$ at a prescribed ratio; first switch 24 for applying reference voltage $V_{REF}$ to second comparator 23 in accordance with burn-in mode signal BIMD; second switch 25 for applying voltage divided at resistors R15 and R16 to second comparator 23 in accordance with burn-in mode signal BIMD; and inverter 26 for inverting and outputting burn-in mode signal BIMD.

Voltage detecting circuit 14 compares a voltage obtained by resistance-dividing external power supply voltage $V_{CC}$ with reference voltage $V_{REF}$, and outputs a high-level (burn-in mode) as burn-in mode signal BIMD when $V_{CC} \times K > V_{REF}$. When $V_{CC} \times K < V_{REF}$, voltage detecting circuit 14 outputs a low level (non-burn-in mode) as burn-in mode signal BIMD. In this case, K=R12/(R11+R12).

Decision circuit 11 compares a voltage obtained by resistance-dividing stepped-up voltage $V_{BOOT}$ with reference voltage $V_{REF}$ when burn-in mode signal BIMD is low level (non-burn-in mode), and outputs a low level as status signal ST when $V_{BOOT} \times L > V_{REF}$. When $V_{BOOT} \times L < V_{REF}$, decision circuit 11 outputs a high level as status signal ST. In this case, L=R18/(R17+R18).

Decision circuit 11 compares a voltage obtained by resistance-dividing stepped-up voltage $V_{BOOT}$ with a voltage obtained by resistance-dividing external power supply voltage $V_{CC}$ when burn-in mode signal BIMD is high level (burn-in mode), and outputs a low level as status signal ST when $V_{BOOT} > M \times V_{CC}$. When $V_{BOOT} < M \times V_{CC}$, decision circuit 11 outputs a high level as status signal ST. In this case, M=R16 (R17+R18)/{R18 (R15+R16)}.

As shown in FIG. 6, clock generating circuit 12 is made up of: ring oscillator 31, which is a feedback loop made up of a plurality of logic gates connected in a series for outputting clock $\phi_0$ of a prescribed frequency; first delay circuit 32 for inverting clock $\phi_0$ outputted from ring oscillator 31 and delaying a prescribed time interval (Tda) and outputting the result as clock $\phi_A$; second delay circuit 33 for inverting clock $\phi_0$ (INV$\phi_0$) that was outputted from ring oscillator 31 and outputting clock $\phi_B$ that becomes low level a prescribed time interval (Tdb) after INV$\phi_0$ becomes high level and that becomes high level at the same time INV$\phi_0$ becomes low level; and third delay circuit 34 for outputting clock $\phi_C$ that becomes low level a prescribed time interval (Tdc) after clock signal $\phi_0$, which was outputted from ring oscillator 31, becomes high level, and that becomes high level at the same time clock $\phi_0$ becomes low level. In this case, it is preferable that Tdb=Tdc=2Tda. If these delay times are made too long, the step-up time interval becomes short, extending the time necessary for obtaining the prescribed stepped-up voltage and decreasing the step-up efficiency. If these delay times are made too short, on the other hand, a short-circuit current flows to the step-up circuit due to, for example, discrepancies between elements, thereby increasing current consumption and preventing voltage step-up.

Figure 7:
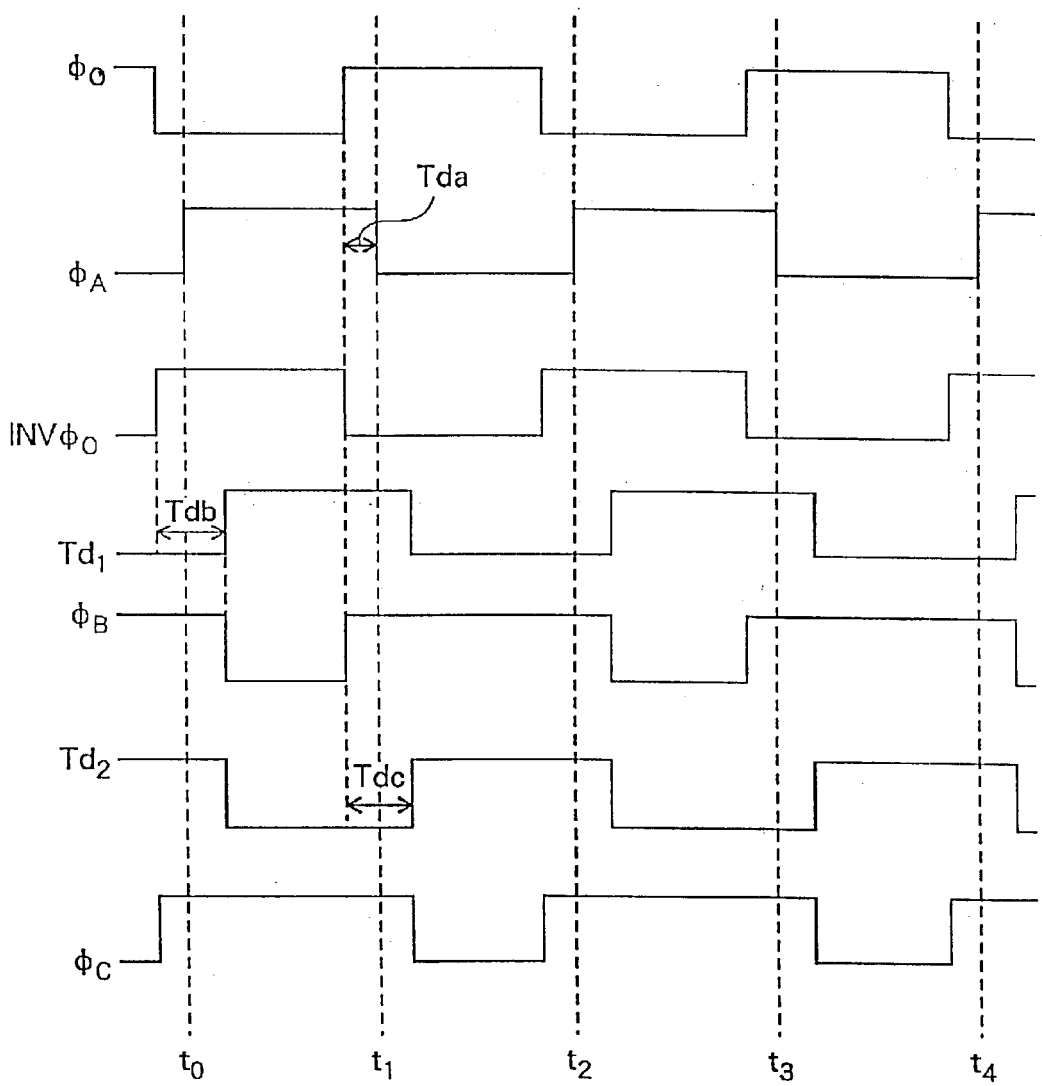
FIG. 7 is waveform chart showing the operating states of the clock generating circuit shown in FIG. 6.

Ring oscillator 31 oscillates and outputs clock $\phi_0$ when status signal ST is high level and stops oscillating when status signal ST is low level. As shown in FIG. 7, clock $\phi_B$ is a signal that becomes high level during the interval that clock $\phi_A$ is low level, and is a signal having a duty ratio of 50% or less that rises after a delay time Tdb from the fall of clock $\phi_0$. Clock $\phi_C$ is a signal that becomes high level during the interval that clock $\phi_A$ is high level, and is a signal having a duty ratio of 50% or less that rises after a delay time of Tdc from the rise of clock $\phi_0$.

Figure 8:
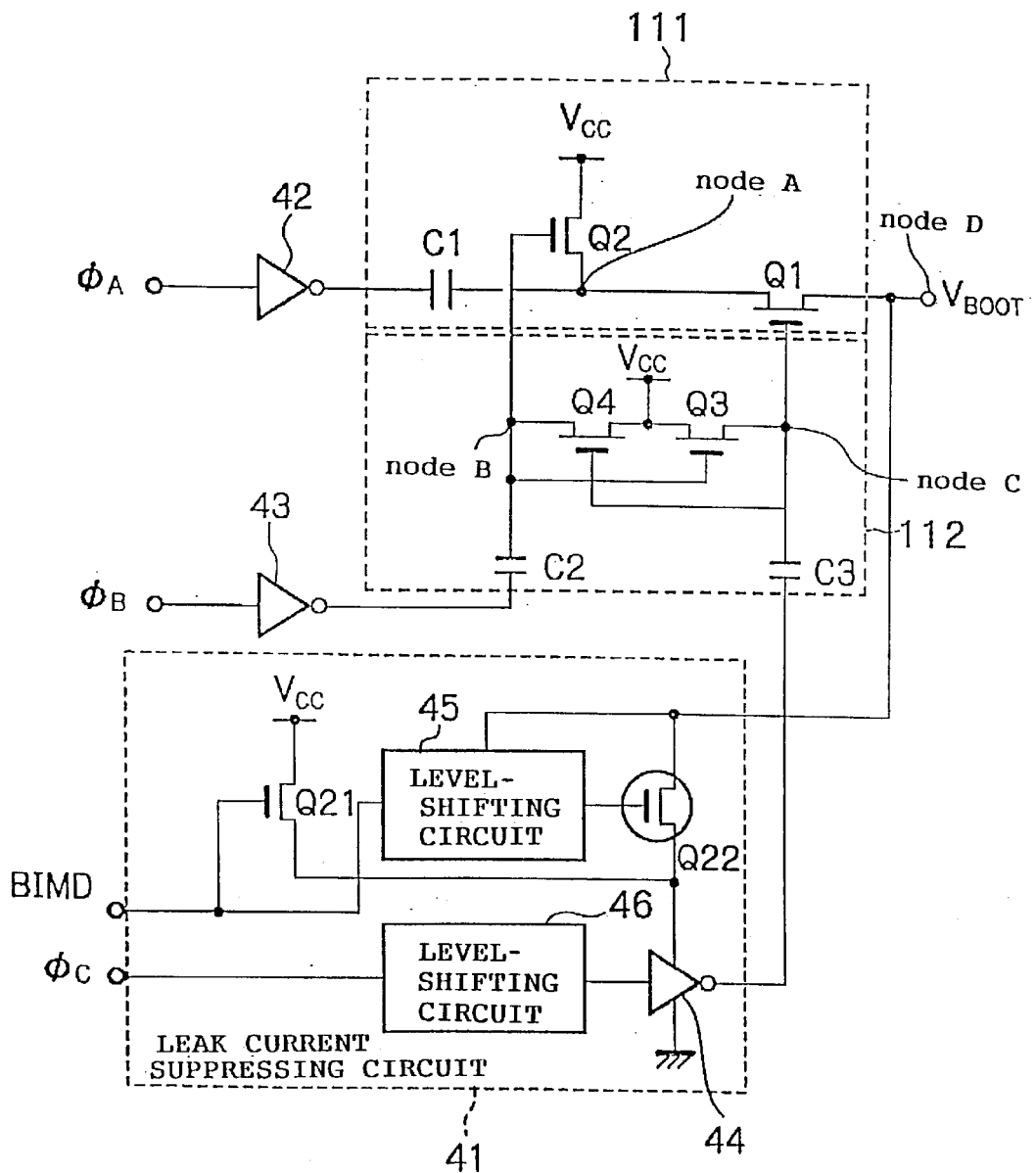
FIG. 8 is a circuit diagram showing the configuration of the first embodiment of the charge pump circuit belonging to the step-up circuit shown in FIG. 4.
Figure 9:
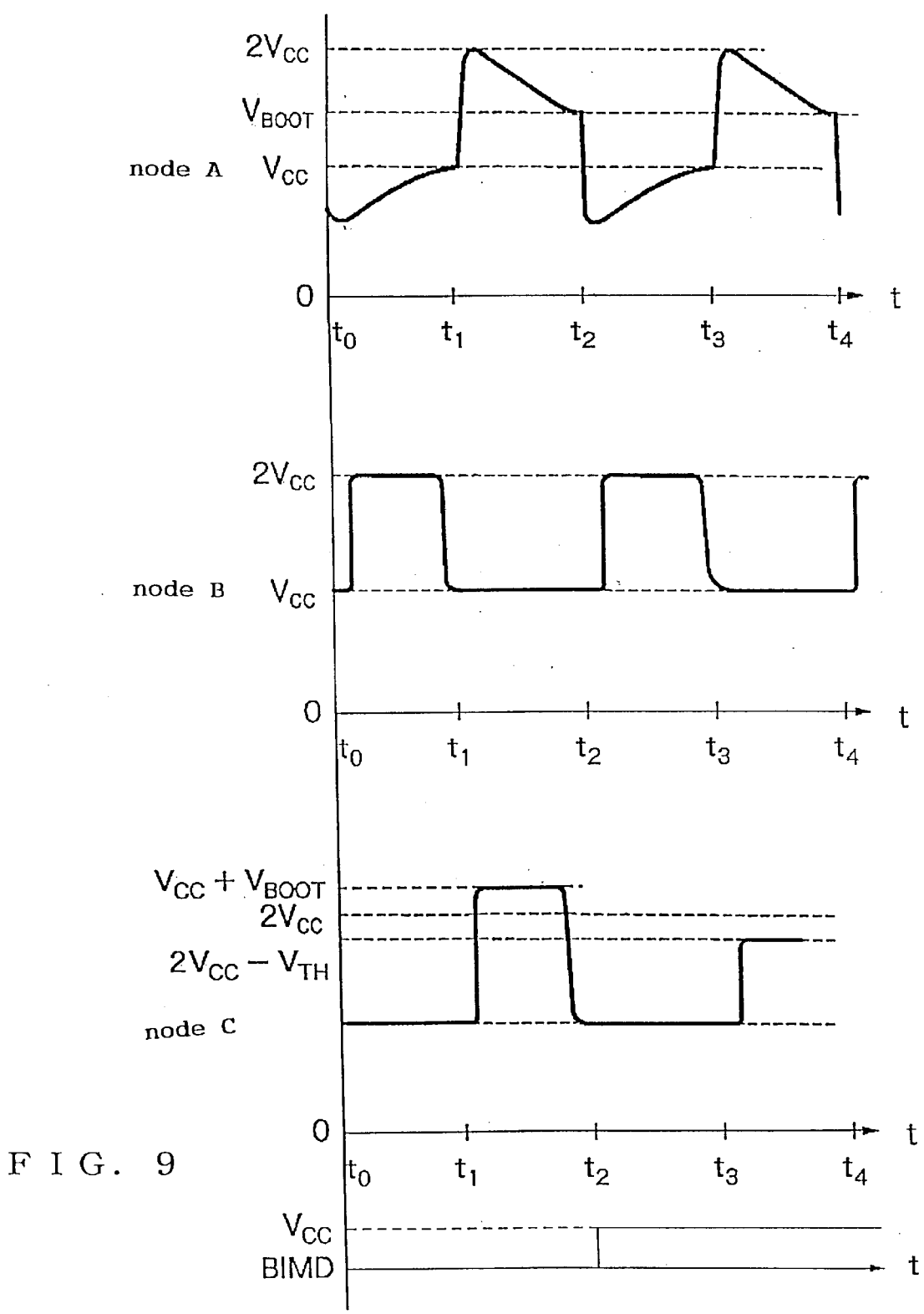
FIG. 9 is a waveform chart showing the voltage waveform generated at each node of the charge pump circuit shown in FIG. 8.
Figure 10:
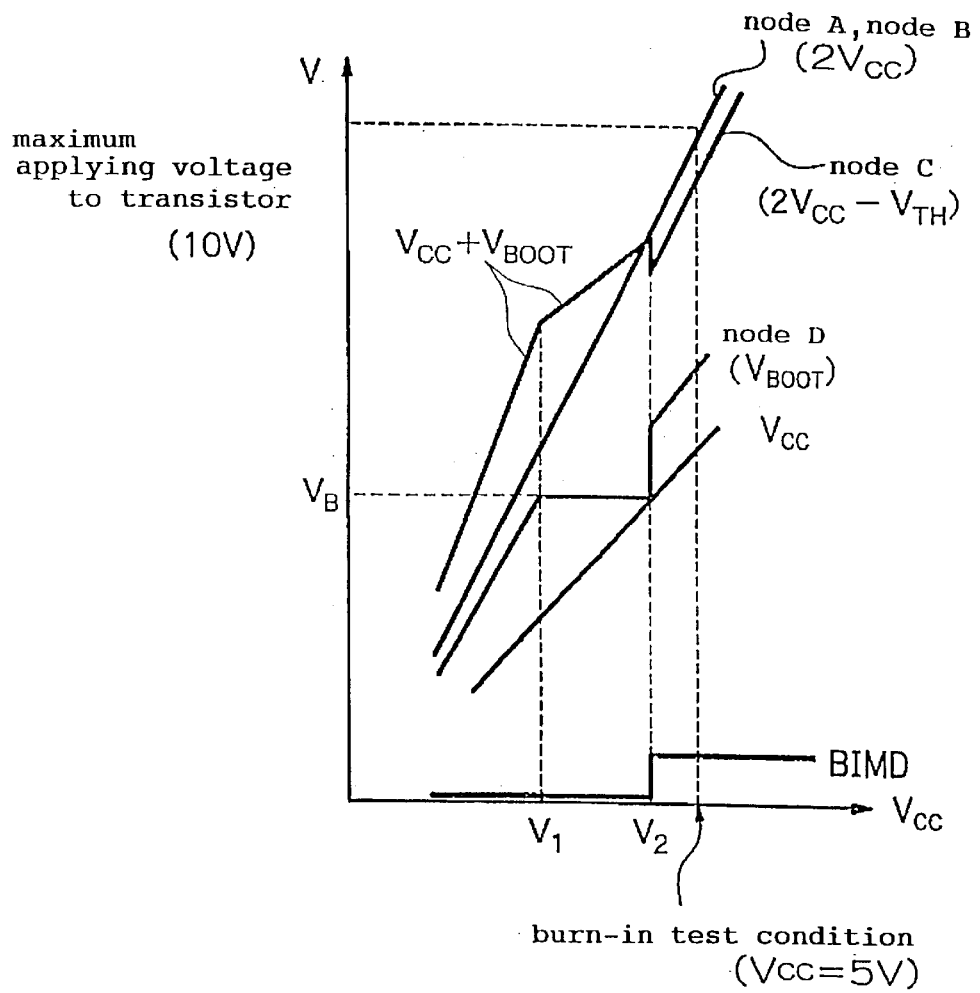
FIG. 10 is a graph showing the relation of the maximum voltage generated at each node to change in the external power supply voltage of the charge pump circuit shown in FIG. 8.

Referring now to FIGS. 8–10, explanation is presented regarding charge pump circuit 13 belonging to the step-up circuit shown in FIG. 4. Burn-in mode signal BIMD shown in FIG. 10 indicates only the value of external power supply voltage $V_{CC}$ at which the mode switches, and this high-level voltage does not indicate a correct value. The voltage that can be applied to each NMOS transistor making up the charge pump circuit of this embodiment is 10 V.

In FIG. 8, charge pump circuit 13 of this embodiment is a configuration in which leak current suppressing circuit 41 is added to the configuration of the charge pump circuit of the third example of the prior art shown in FIG. 1. Clock $\phi_C$ is applied to step-up up capacitor C3 by way of leak current suppressing circuit 41. Clock $\phi_A$ is applied to step-up capacitor C1 by way of first buffer 42, and clock $\phi_B$ is applied to step-up capacitor C2 by way of second buffer 43. The external power supply voltage $V_{CC}$ is supplied to first buffer 42 and second buffer 43.

Leak current suppressing circuit 41 is made up of: third buffer 44 for converting received clock $\phi_C$ to amplitude equal to that of the supplied power supply voltage and outputting the result; NMOS transistor Q21 that is ON/OFF controlled by burn-in mode signal BIMD and that supplies external power supply voltage $V_{CC}$ to third buffer 44 during a burn-in test; p-channel MOS field effect transistor (hereinbelow referred to as a "PMOS transistor") Q22 that is ON/OFF controlled by burn-in mode signal BIMD and that supplies stepped-up voltage $V_{BOOT}$ to third buffer 44 during normal operation; level-shifting circuit 45 for converting the level of burn-in mode signal BIND to enable driving of PMOS transistor Q22; and level-shifting circuit 46 for converting the level of clock $\phi_C$. Level-shifting circuit 46 shifts the level of clock $\phi_C$, which varies between 0–$V_{CC}$, to an output voltage that varies between 0 V and power supply voltage ($V_{CC}$-$V_{TH}$) or $V_{BOOT}$, and supplies the result to third buffer 44. In addition, a load capacitance (not shown) for smoothing the output voltage is connected to node D, which is the terminal that outputs stepped-up voltage $V_{BOOT}$. The configuration is otherwise the same as that of the third example of the prior art, and further explanation is therefore here omitted.

In this configuration, PMOS transistor Q22 turns ON when burn-in mode signal BIMD is low level (during normal operation) and clock $\phi_C$ having amplitude of stepped-up voltage $V_{BOOT}$ is therefore outputted from leak current suppressing circuit 41. When burn-in mode signal BIMD is high level (during a burn-in test), NMOS transistor Q21 turns ON, and clock $\phi_C$ having amplitude of external power supply voltage $V_{CC}$-$V_{TH}$ is outputted from leak current suppressing circuit 41. In other words, the potential of node C is suppressed to a prescribed value (the voltage at which leakage begins in transistor Q3) or lower in this embodiment by switching the power supply voltage supplied to logic gate 44, which is a constituent element of leak current suppressing circuit 41, between the times of normal operation and burn-in mode.

At this time, the voltage at node A and node B is suppressed to $2V_{CC}$ or lower and the voltage at node C is suppressed to $2V_{CC}$-$V_{TH}$ or lower, as shown in FIGS. 9 and 10. When power supply voltage $V_{CC}$ is lower than $V_1$, burn-in mode signal BIMD is low level and status signal ST is high level, and clock generating circuit 12 therefore supplies clocks $\phi_A$–$\phi_C$ to charge pump circuit 13 without halts. The voltage at nodes A–C therefore increases in proportion to power supply voltage $V_{CC}$.

When power supply voltage $V_{CC}$ is within the range of the normal operating voltage $V_1$–$V_2$, and when burn-in mode signal BIMD is low level and stepped-up voltage $V_{BOOT}$ exceeds a prescribed voltage $V_B$, status signal ST becomes low level, and clock generating circuit 12 halts the supply of clocks $\phi_A$–$\phi_C$ to charge pump circuit 13 so as to decrease stepped-up voltage $V_{BOOT}$. When stepped-up voltage $V_{BOOT}$ falls below voltage $V_B$, on the other hand, status signal ST becomes high level and clock generating circuit 12 supplies clocks $\phi_A$–$\phi_C$ to charge pump circuit 13 so as to increase stepped-up voltage $V_{BOOT}$. In this way, stepped-up voltage $V_{BOOT}$ of node D is controlled by step-up circuit 7 to equal a fixed voltage $V_B$ when power supply voltage $V_{CC}$ is within the range of the operating voltage $V_1$–$V_2$.

The voltage at node A and node B ($2V_{CC}$) increases in proportion to power supply voltage $V_{CC}$ when status signal ST is high level. When status signal ST becomes low level, however, clocks $\phi_A$ and $\phi_B$ are halted, and the voltage of node A and node B is therefore gradually discharged.

The voltage at node C ($V_{CC}$+$V_{BOOT}$) increases in proportion to power supply voltage $V_{CC}$ when status signal ST is high level. When status signal ST becomes low level, however, clock $\phi_C$ is halted and the voltage of node C is therefore gradually discharged. Burn-in mode signal BIMD becomes high level when power supply voltage $V_{CC}$ is higher than $V_2$, and when stepped-up voltage $V_{BOOT}$ exceeds a prescribed voltage $M \times V_{CC}$, status signal ST becomes low level and clock generating circuit 12 halts the supply of clocks $\phi_A$–$\phi_C$ to charge pump circuit 13 to decrease stepped-up voltage $V_{BOOT}$. When stepped-up voltage $V_{BOOT}$ falls below prescribed voltage $M \times V_{CC}$, on the other hand, status signal ST becomes high level and clock generating circuit 12 supplies clocks $\phi_A$–$\phi_C$ to charge pump circuit 13 to raise stepped-up voltage $V_{BOOT}$. In this way, when power supply voltage $V_{CC}$ exceeds $V_2$, stepped-up voltage $V_{BOOT}$ at node D is controlled by step-up circuit 7 to become the prescribed voltage $M \times V_{CC}$.

The voltage of node A and node B ($2V_{CC}$) increases in proportion to power supply voltage $V_{CC}$ when status signal ST is high level. When status signal ST becomes low level, however, clocks $\phi_A$ and $\phi_B$ are halted and the voltage of node A and node B is therefore gradually discharged.

The voltage of node C ($2V_{CC}$-$V_{TH}$) increases in proportion to power supply voltage $V_{CC}$ when status signal ST is high level. When status signal ST becomes low level, however, clock $\phi$C is halted and the voltage of node C is therefore gradually discharged.

Because a voltage higher than stepped-up voltage $V_{BOOT}$ is thus supplied to the gate of transistor Q1 while within the range of normal operating voltage $V_1$–$V_2$, the voltage drop of transistor Q1 can be suppressed to a minimum and a step-up circuit having high step-up efficiency can be realized.

In a case in which leak current suppressing circuit 41 is not provided, assuming power supply voltage $V_{CC}$ is 5 V during a burn-in test, the voltage of node C becomes $V_{CC}+V_{BOOT}$ and exceeds 10 V. Since the voltage between the source and well regions of transistor Q3 therefore exceeds the voltage endurance, leak current increases and breakdown occurs.

If leak current suppressing circuit 41 is provided as in the present embodiment, the voltage at node C, can be suppressed to $2V_{CC}-V_{TH}$, i.e., 10 V, or less, even if power supply voltage $V_{CC}$ should exceed $V_2$, and as a result, no leak current occurs at the junction of the source and well regions of transistor Q3.

Figure 11:
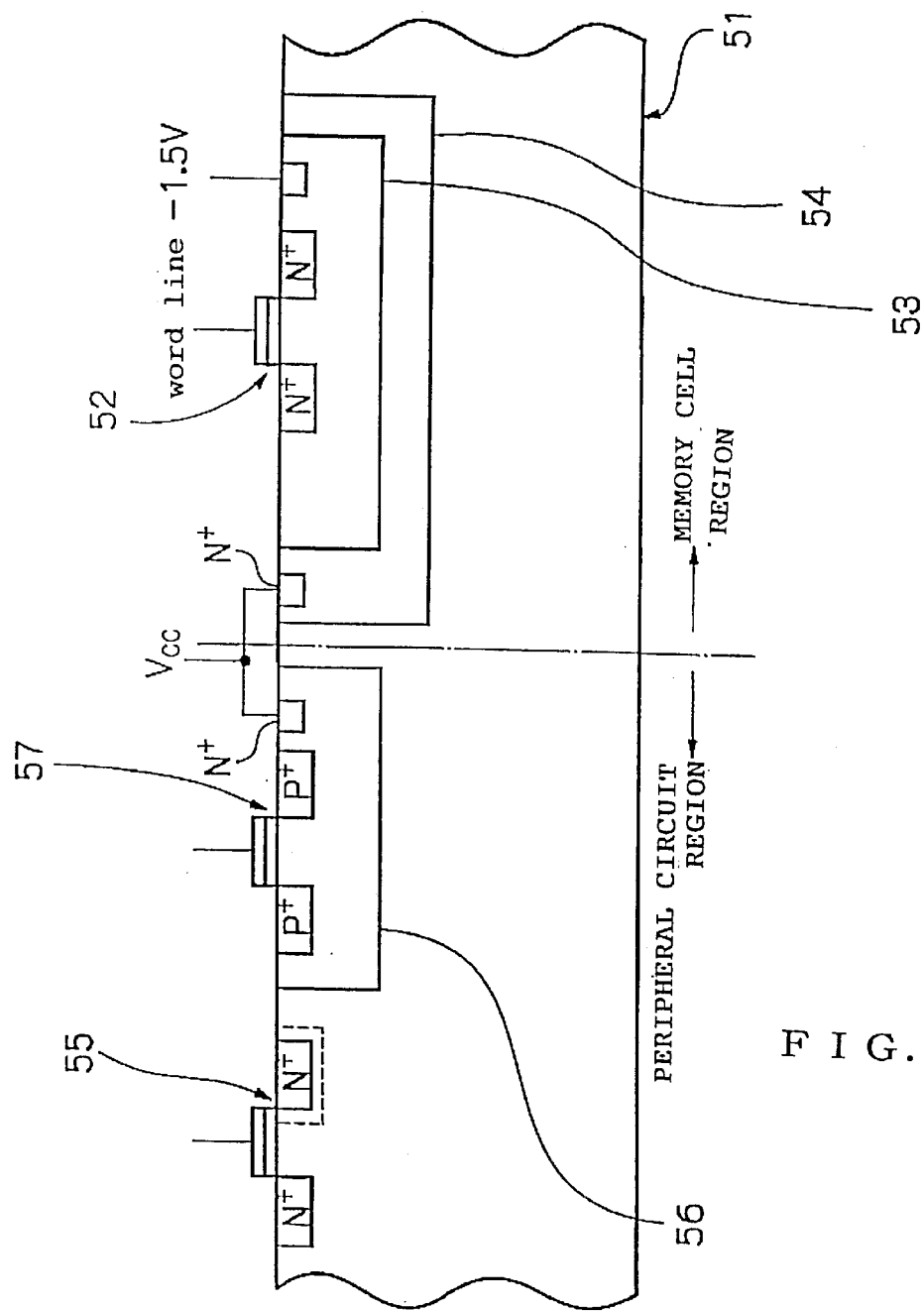
FIG. 11 is a side sectional view showing the construction of a semiconductor memory device that includes the first embodiment of the charge pump circuit belonging to the step-up circuit shown in FIG. 4.

Referring now to FIG. 11, the device configuration of a semiconductor memory device containing step-up circuit 7 of the present embodiment is next explained. FIG. 11 shows only the construction of elements that are necessary to the following explanation.

As shown in FIG. 11, a semiconductor memory device equipped with step-up circuit 7 of this embodiment includes p-substrate 51 composed of a p-type semiconductor, p-substrate 51 being biased to 0 V. NMOS transistor 52 formed within the memory cell region is separated from p-substrate 51 by a two-layer well region (p-well region 53, which is a p-type diffusion layer, and deep N-well region 54, which is an n-type diffusion layer), and p-well region 53 is biased to −1.5 V to prevent the loss of charge that is stored in the capacitors of the memory cell region due to, for example, noise.

NMOS transistor 55, which is formed in p-substrate 51 or a p-well region not shown in the figure, and PMOS transistor 57, which is formed within n-well region 56, are present in the peripheral circuit regions that contain step-up circuit 7.

If external power supply voltage $V_{CC}$ is set to 5 V as a condition during a burn-in test in this case, the potential difference between p-substrate 51 and the sources or drains of NMOS transistors Q1–Q4 connected to node A and node B of above-described charge pump circuit 13 corresponding to NMOS transistor 55 is suppressed to 10 V or less.

As a result, voltage applied to the diffusion layer of the transistor can be suppressed to within the junction voltage endurance even if external power supply voltage $V_{CC}$ should become high, thereby eliminating breakdown of the transistors of the step-up circuit or leak current flowing from the source or drain of a transistor toward the p-substrate in a burn-in test.

Furthermore, the necessity for additional masks or processes is eliminated because there is no need for a separate process to produce transistors for high voltage endurance, and transistors can be manufactured in the same process as transistors making up other peripheral circuit or transistors of memory cells. Consequently, fabrication costs can be cut and the price of the semiconductor memory device can be reduced. In addition, the chip area and base price are not increased because there is no increase in the size of the transistors.

As in the second example of the prior art, moreover, a configuration is adopted that does not employ diode-connected rectification transistors, and the voltage drop caused by rectification transistors can therefore be reduced.

In addition, the drive capability of NMOS transistor Q1 is increased because NMOS transistor Q1 is driven by high voltage after step-up. As a result, voltage drops can be decreased even with the use of compact transistors, thereby enabling a charge pump circuit having high rectification efficiency.

Second Embodiment

Figure 12:
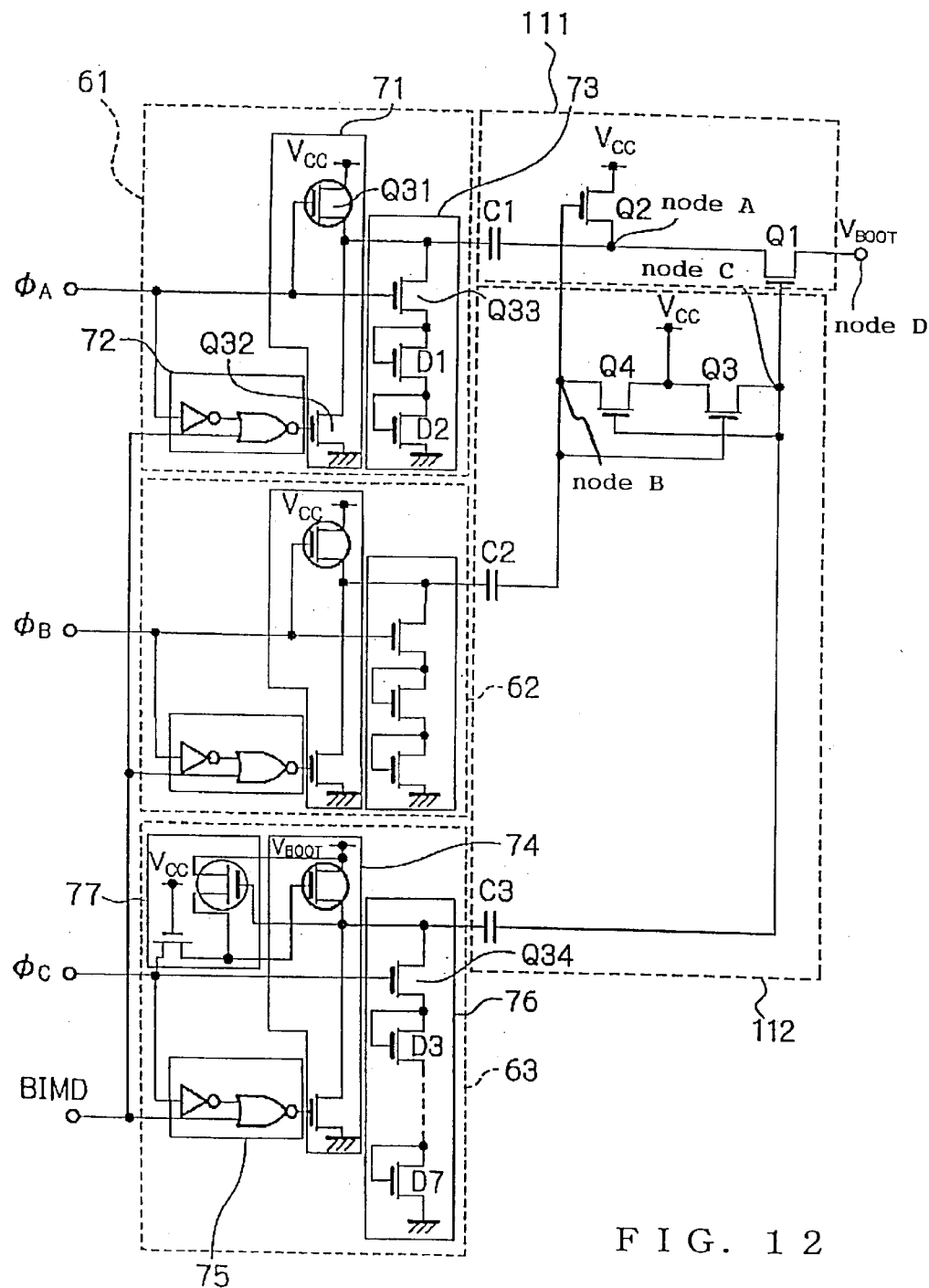
FIG. 12 is a circuit diagram showing the configuration of the second embodiment of the charge pump circuit belonging to the step-up circuit shown in FIG. 4.
Figure 13:
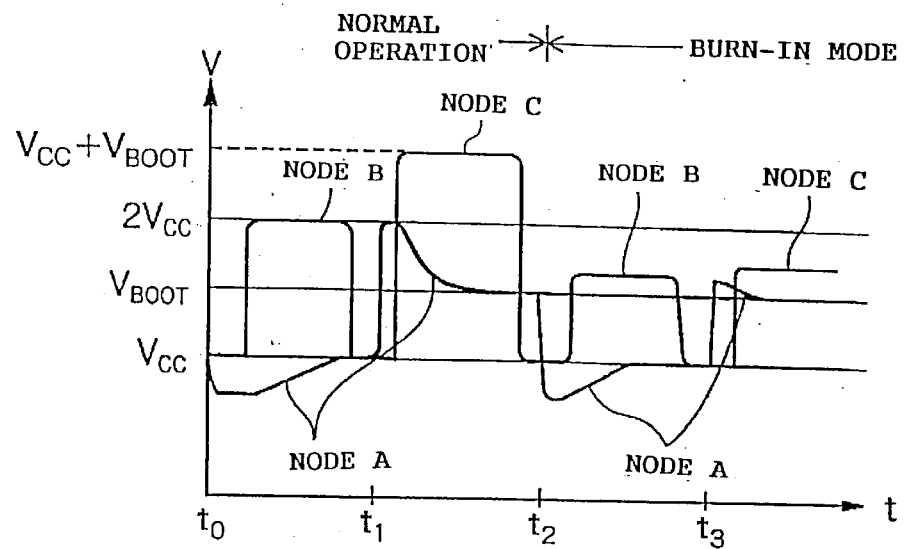
FIG. 13 is a waveform chart showing the voltage waveforms generated at each node of the charge pump circuit shown in FIG. 12.
Figure 14:
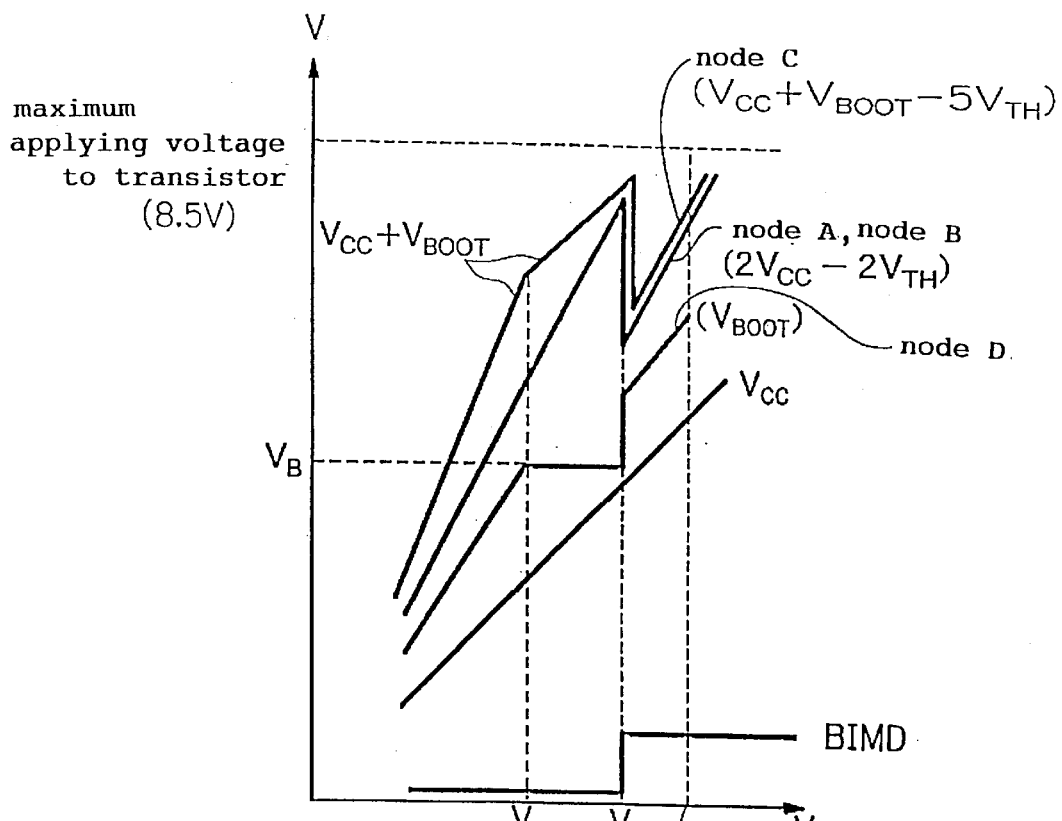
FIG. 14 is a graph showing the relation of the maximum voltage generated at each node to change in the external power supply voltage of the charge pump circuit shown in FIG. 12.

Explanation is next presented with reference to FIGS. 12–14 regarding the second embodiment of a charge pump circuit belonging to the step-up circuit shown in FIG. 4. The burn-in mode signal BIMD shown in FIG. 14 shows only the value of external power supply voltage $V_{CC}$ at which modes switch, and this high-level voltage does not indicate the correct value. The voltage that can be applied to each of the NMOS transistors that make up the charge pump circuit in this embodiment is 10 V.

In FIG. 12, the charge pump circuit belonging to the step-up circuit of this embodiment has a configuration in which first leak current suppressing circuit 61-third leak current suppressing circuit 63 for suppressing amplitude of each clock ($\phi_A$, $\phi_B$, $\phi_C$) during a burn-in test are added to the configuration of the third example of the prior art shown in FIG. 1. Clocks/$\phi_A$–/$\phi_C$ are signals that are the inverted clocks $\phi_A$–$\phi_C$ of clock generating circuit 12 shown in FIG. 6. External power supply voltage $V_{CC}$ is supplied to first leak current suppressing circuit 61 for limiting amplitude of clock $\phi_A$ and to second leak current suppressing circuit 62 for limiting amplitude of clock $\phi_B$, and stepped-up voltage $V_{BOOT}$ is supplied to third leak current suppressing circuit 63 for limiting amplitude of clock $\phi_C$.

First leak current suppressing circuit 61 has a construction that includes: inverter 71 composed of PMOS transistor Q31 and NMOS transistor Q32 for inverting and outputting received clocks; gate circuit 72 for halting the operation of NMOS transistor Q32 of inverter 71 during a burn-in test in accordance with burn-in mode signal BIMD; and bias circuit 73 for setting the low-level output voltage of the inverter to a prescribed level during a burn-in test in accordance with burn-in mode signal BIMD.

Bias circuit 73 is a configuration including: a plurality of diodes D1 and D2 connected in a series made up of NMOS transistors having drains and gates connected in common; and NMOS transistor Q33 that is connected in a series with diodes and that is ON/OFF controlled by clock input. During the normal operation mode, transistor Q32 turns ON whereby the drain voltage of transistor Q33 becomes substantially 0 V and transistor Q33 does not operate.

Second leak current suppressing circuit 62 is of the same construction as first leak current suppressing circuit 61. In third leak current suppressing circuit 63, the power supply that is supplied to inverter 74 is stepped-up voltage $V_{BOOT}$, and bias circuit 76 is a construction including five diodes D3–D7 and NMOS transistor Q34 connected in a series. Clock/$\phi_C$ is supplied by way of level shifter 77 to the gate of the PMOS transistor that is a constituent element of inverter 74. Level shifter 77 is provided for turning OFF above-described PMOS transistor when clock/$\phi_C$ is high level ($V_{CC}$), the source of the PMOS transistor being stepped-up voltage $V_{BOOT}$.

Gate circuit 75 has the same construction as the gate circuits of first leak current suppressing circuit 61 and second leak current suppressing circuit 62. The construction is otherwise the same as that of the first embodiment and further explanation is therefore here omitted.

In first leak current suppressing circuit 61-third leak current suppressing circuit 63 of this construction, each gate circuit passes a respective clock $\phi_A$–$\phi_C$ when burn-in mode signal BIMD is low level (during normal operation). At this time, a clock having amplitude of $V_{CC}$ is outputted from the inverters 71 of each of first leak current suppressing circuit 61, which receives clock ϕ$_A$, and second leak current suppressing circuit 62, which receives clock ϕ$_B$, while a clock having amplitude of V$_{BOOT}$ is outputted from inverter 74 of third leak current suppressing circuit 63, which receives clock ϕ$_C$.

When burn-in mode signal BIMD is high level (during a burn-in test), on the other hand, each of the gate circuits fixes its output to low level without passing a clock. The operation of the NMOS transistor of each inverter therefore halts, and the low level of the output voltage of each of first leak current suppressing circuit 61-third leak current suppressing circuit 63 is set to a prescribed level by the respective bias circuit.

In the construction of the bias circuits shown in FIG. 12, the low level is determined by the number of diodes. If the forward voltage per diode is V$_T$, the clocks outputted from first leak current suppressing circuit 61 and second leak current suppressing circuit 62 will have amplitude of V$_{CC}$-2V$_T$, and the clock outputted from third leak current suppressing circuit 63 will have amplitude of V$_{BOOT}$-5V$_T$.

As shown in FIG. 13 and FIG. 14, the voltage of node A and node B at this time is suppressed to 2V$_{CC}$-2V$_T$ or less (8.5 V or less), and the voltage of node C is suppressed to V$_{CC}$+V$_{BOOT}$-5V$_T$ or less (8.5 V or less). In this embodiment, moreover, stepped-up voltage V$_{BOOT}$ is determined according to the setting of decision circuit 11 and not according to the limiting of amplitude of clocks at bias circuits 73 and 76 in first leak current suppressing circuit 61-third leak current suppressing circuit 63. In other words, bias circuits 73 and 76 are for suppressing the voltages of nodes A–C to prescribed values and suppressing leakage at junctions, and stepped-up voltage V$_{BOOT}$ is determined by the interval of supply of clocks supplied from clock generating circuit 12.

In this embodiment, a case is described in which NMOS transistors are diode-connected and the minimum clock amplitude is set to a prescribed voltage, but a case in which PMOS transistors are diode-connected and the maximum clock amplitude is set to a prescribed voltage is also possible.

Figure 15:
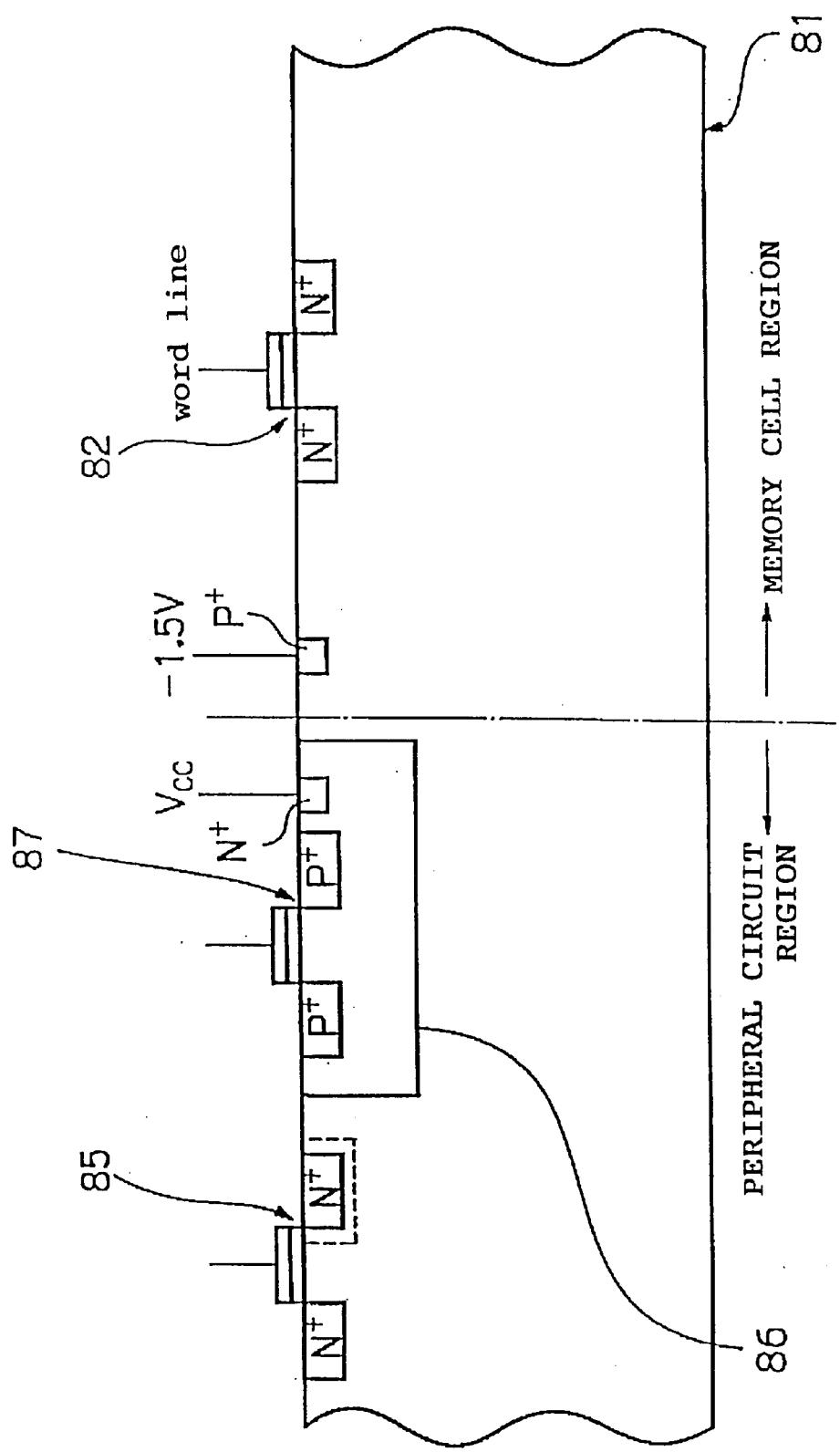
FIG. 15 is a side sectional view showing the construction of the semiconductor memory device that includes the second embodiment of the charge pump circuit belonging to the step-up circuit shown in FIG. 4.

In this embodiment, a case is described in which first leak current suppressing circuit 61-third leak current suppressing circuit 63 are provided for clocks /ϕ$_A$–/ϕ$_C$, but the positions of arrangement of these circuits can be appropriately determined according to the junction voltage endurance of the transistors, and a case is also possible in which, for example, only third leak current suppressing circuit 63 is provided and first leak current suppressing circuit 61 and second leak current suppressing circuit 62 are not provided. The device configuration of a semiconductor memory device including the step-up circuit of this embodiment is next described with reference to FIG. 15. FIG. 15 shows only those constituent elements that are necessary to the following explanation.

As shown in FIG. 15, a semiconductor memory device that is provided with the step-up circuit of this embodiment includes p-substrate 81 composed of a p-type semiconductor, and p-substrate 81 is biased to -1.5 V to prevent the loss, due to, for example, noise, of charge that is stored in capacitors of memory cell regions.

NMOS transistor 82 is formed within the memory cell region. NMOS transistor 85 formed in p-substrate 81 or in a p-well region not shown in the figure that is supplied with the same bias as p-substrate 81, and PMOS transistor 87 formed in n-well region 86 are present in the peripheral circuit region that contains the step-up circuit.

In this case, if external power supply voltage V$_{CC}$ is set to 5 V as a condition during a burn-in test, the source potential or drain potential of NMOS transistor 85 corresponding to NMOS transistors Q1–Q4 connected to node A-node C of the charge pump circuit is suppressed to 8.5 V or less as described hereinabove, and the potential difference with p-substrate 81 is therefore suppressed to 10 V or less.

The adverse effect upon the operation of transistors in the memory cell region caused by rises in the potential of p-substrate 81 that occur due to the flow of leak current can thus be eliminated.

The use of transistors having low voltage endurance to construct the step-up circuit does not result in the flow of leak current between the transistors and the semiconductor substrate or wells, or in breakdown at junctions, and as a result, the potential of the p-substrate does not rise due to leak currents even though the memory cell region and peripheral circuits such as a step-up circuit are formed in the same p-substrate or p-well and supplied with the same bias voltage.

Consequently, data that are recorded in memory cells are not destroyed.

This construction also eliminates the flow of leak current from the source or drain of a transistor toward p-substrate 81 as well as the breakdown of transistors of the step-up circuit in a burn-in test.

In addition, since there is no need to form the well region as a plurality of layers as in the first embodiment, this construction allows the omission of one step for fabricating the well and a consequent reduction of production costs.

Third Embodiment

Figure 16:
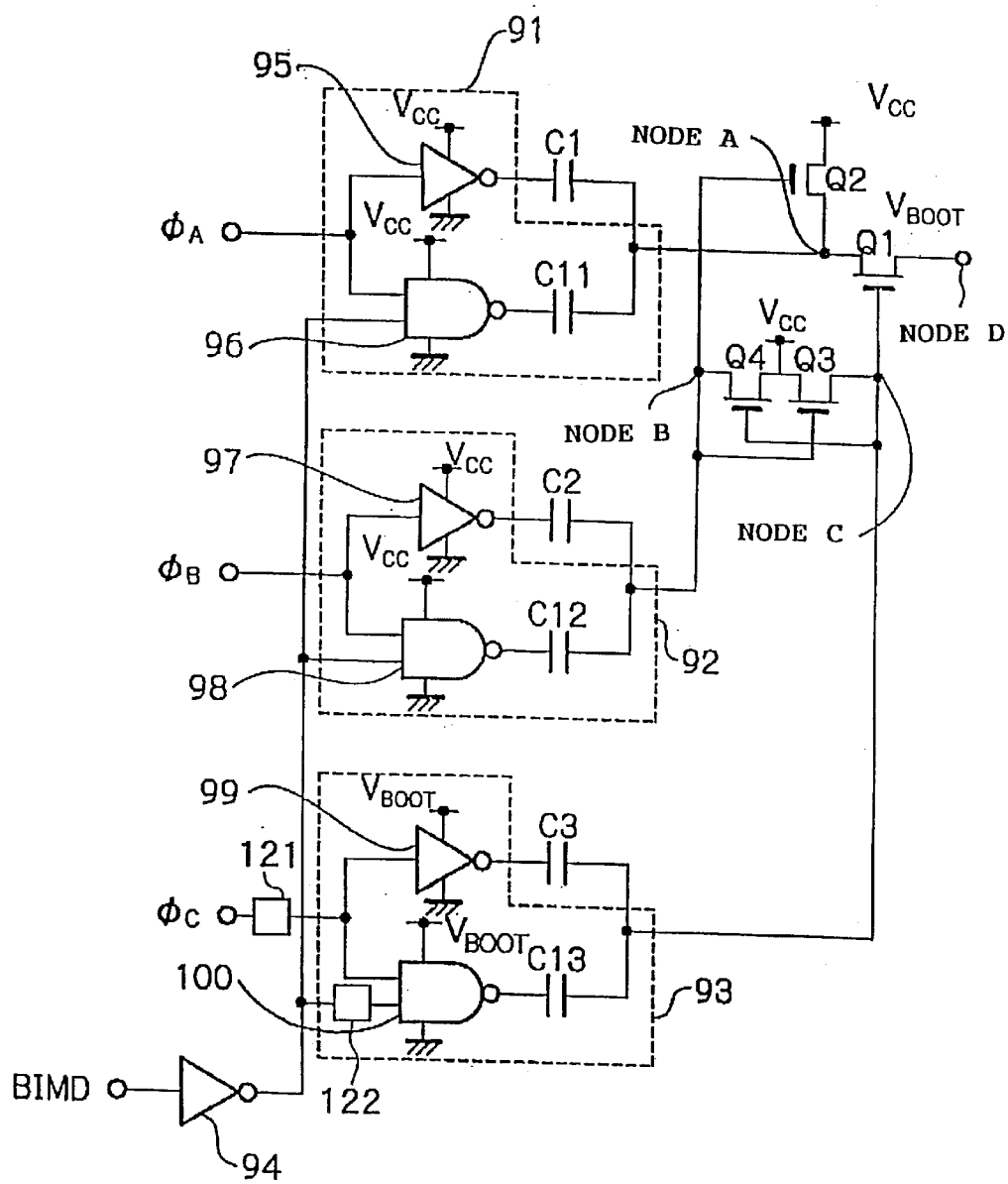
FIG. 16 is a circuit diagram showing the construction of the third embodiment of the charge pump circuit belonging to the step-up circuit shown in FIG. 4.

In FIG. 16, the construction of first leak current suppressing circuit 91-third leak current suppressing circuit 93 for limiting amplitude of each clock (ϕ$_A$, ϕ$_B$, ϕ$_C$) during a burn-in test in the charge pump circuit of this embodiment differs from the construction of the second embodiment. The charge pump circuit of this embodiment also incorporates a fourth inverter 94 that inverts and outputs the burn-in mode signal BIMD.

First leak current suppressing circuit 91 is a construction that includes: first inverter 95 for inverting clock ϕ$_A$ and outputting to step-up capacitor C1; first NAND gate 96 for receiving clock ϕ$_A$ and burn-in mode signal BIMD, inverting clock ϕ$_A$ and outputting a clock of the same phase as the output clock of first inverter 95 during normal operation, and halting the output of clocks during a burn-in test; and step-up capacitor C11 having one end connected to the output of first NAND gate 96 and having the other end connected to the output terminal of step-up capacitor C1.

Second leak current suppressing circuit 92 is a construction that includes: second inverter 97 for inverting clock ϕ$_B$ and outputting to step-up capacitor C2; second NAND gate 98 for receiving clock ϕ$_B$ and burn-in mode signal BIMD, inverting clock ϕ$_B$ and outputting a clock of the same phase as the output clock of second inverter 97 during normal operation; and halting the output of clocks during a burn-in test; and step-up capacitor C12 having one end connected to the output of second NAND gate 98 and the other end connected to the output terminal of step-up capacitor C2.

Third leak current suppressing circuit 93 is a construction that includes: third inverter 99 for inverting clock ϕ$_C$ and outputting to step-up capacitor C3; third NAND gate 100 for receiving clock ϕ$_C$ and burn-in mode signal BIMD, inverting clock ϕ$_C$ and outputting a clock of the same phase as the output clock of third inverter 99 during normal operation, and halting the output of clocks during a burn-in test; and step-up capacitor C13 having one end connected to the output of third NAND gate 100 and the other end connected to the output terminal of step-up capacitor C3.

In addition, external power supply voltage $V_{CC}$ is supplied to first inverter 95, second inverter 97, first NAND gate 96, and second NAND gate 98, and stepped-up voltage $V_{BOOT}$ is supplied to third inverter 99 and third NAND gate 100. Clock/$\phi_C$ and burn-in mode signal BIMD are also supplied to third inverter 99 and third NAND gate 100 by way of level shifters 121 and 122, respectively. The construction is otherwise equivalent to that of the second embodiment, and further explanation is therefore here omitted.

In this construction, each of the NAND gates of first leak current suppressing circuit 91-third leak current suppressing circuit 93 passes respective clock $\phi_A$–$\phi_C$ when burn-in mode signal BIMD is low level (during normal operation). At this time, clocks having amplitude of $V_{CC}$ are outputted from each of first inverter 95, second inverter 97, first NAND gate 96, second NAND gate 98, and third NAND 100, and a clock having amplitude of $V_{BOOT}$ is outputted from third inverter 99. Accordingly clocks having amplitude of $2V_{CC}$ are outputted from each of first leak current suppressing circuit 91 and second leak current suppressing circuit 92, and a clock having amplitude of $V_{BOOT}+V_{CC}$ is outputted from third leak current suppressing circuit 93.

When burn-in mode signal BIMD is high level (during a burn-in test), on the other hand, each of the NAND gates fixes output at a high level without passing a respective clock. Since only first inverter 95-third inverter 99 output clocks at this time, clocks having amplitude that is capacitance-divided by two step-up capacitors are outputted from each of first leak current suppressing circuit 91-third leak current suppressing circuit 93.

As with the first embodiment and second embodiment, this embodiment can therefore prevent leak currents that flow toward the p-substrate from the source or drain of transistors and breakdown of transistors of the charge pump circuit during a burn-in test.

Furthermore, the step-up circuits described in the first embodiment and second embodiment do not have configurations such as that of the first example of the prior art, in which a voltage following step-up that has great current-driving capabilities is clamped or limited, and the currents of these embodiments therefore do not entail the flow of a large loss current or increased current consumption as in the first example of the prior art.

While preferred embodiments of the present invention have been described using specific terms, such description is for illustrative purposes only, and it is to be understood that changes and variations may be made without departing from the spirit or scope of the following claims.

What is claimed is:

1. A charge pump circuit for performing multiple-voltage rectification by a first clock, a second clock, and a third clock, and outputting a stepped-up voltage, comprising:
   a first step-up capacitor for receiving said first clock composed of a prescribed cycle;
   a second step-up capacitor for receiving said second clock that becomes high level during the interval that said first clock is low level;
   a third step-up capacitor for receiving said third clock that becomes high level during the interval that said first clock is high level;
   a first transistor that receives the output clock of said first step-up capacitor, that turns ON/OFF in accordance with the output clock of said third step-up capacitor, and that is provided for outputting said stepped-up voltage that is higher than an external power supply voltage supplied from outside;
   a second transistor that turns ON/OFF in accordance with the output clock of said second step-up capacitor and that is provided for biasing the output voltage of said first step-up capacitor by the external power supply voltage;
   a third transistor that turns ON/OFF in accordance with the output clock of said second step-up capacitor and that is provided for biasing the output voltage of said third step-up capacitor by the external power supply voltage; and
   a fourth transistor that turns ON/OFF in accordance with the output clock of said third step-up capacitor and that is provided for biasing the output voltage of said second step-up capacitor by the external power supply voltage;
   said charge pump circuit further including:
   a leak current suppressing circuit that outputs said third clock at amplitude of said stepped-up voltage during normal operation and outputs said third clock at amplitude of said external power supply voltage during a burn-in test.

2. The charge pump circuit according to claim 1, wherein said leak current suppressing circuit comprises:
   a buffer circuit for converting said third clock that is received to amplitude that is equal to a power supply voltage that is supplied and outputting the result;
   a fifth transistor for supplying said stepped-up voltage to said buffer circuit as said power supply voltage during normal operation; and
   a sixth transistor for supplying said external power supply voltage to said buffer circuit as said power supply voltage during a burn-in test.

3. A step-up circuit comprising:
   a charge pump circuit according to claims ;
   a clock generating circuit for generating said first clock, said second clock, and said third clock, and for outputting each of said clocks to said charge pump circuit;
   a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and
   a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test is received.

4. A step-up circuit comprising:
   a charge pump circuit according to claim 1;
   a clock generating circuit for generating said first clock, said second clock, and said third clock, and for outputting each of said clocks to said charge pump circuit;
   a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test is received.

5. A charge pump circuit for performing multiple-voltage rectification in accordance with a first clock, a second clock, and a third clock and outputting a stepped-up voltage, comprising:

a first step-up capacitor for receiving said first clock composed of a prescribed cycle;

a second step-up capacitor for receiving said second clock that becomes high level in the interval that said first clock is low level;

a third step-up capacitor for receiving said third clock that becomes high level in the interval that said first clock is high level;

a first transistor that receives the output clock of said first step-up capacitor, that turns ON/OFF in accordance with the output clock of said third step-up capacitor, and that is provided for outputting said stepped-up voltage that is higher than an external power supply voltage that is supplied from outside;

a second transistor that turns ON/OFF in accordance with the output clock of said second step-up capacitor and that is provided for biasing the output voltage of said first step-up capacitor by the external power supply voltage;

a third transistor that turns ON/OFF in accordance with the output clock of said second step-up capacitor and that is provided for biasing the output voltage of said third step-up capacitor by the external power supply voltage; and a fourth transistor that turns ON/OFF in accordance with the output clock of said third step-up capacitor and that is provided for biasing the output voltage of said second step-up capacitor by the external power supply voltage;

said charge pump circuit further including:

a first leak current suppressing circuit for outputting said first clock at amplitude of said external power supply voltage during normal operation, and for outputting said first clock at a prescribed amplitude that is lower than said external power supply voltage during a burn-in test;

a second leak current suppressing circuit for outputting said second clock at amplitude of said external power supply voltage during normal operation, and for outputting said second clock at a prescribed amplitude that is lower than said external power supply voltage during a burn-in test; and a third leak current suppressing circuit for outputting said third clock at amplitude of said stepped-up voltage during normal operation, and for outputting said third clock at a prescribed amplitude that is lower than said stepped-up voltage during a burn-in test.

6. The charge pump circuit according to claim 5 wherein each of said first leak current suppressing circuit, second leak current suppressing circuit, and third leak current suppressing circuit comprises:

an inverter for inverting and outputting a received clock;

a gate circuit for halting the operation of a fifth transistor for outputting low level of said inverter during a burn-in test; and a bias circuit for setting the low-level output voltage of said inverter to a prescribed voltage in place of said fifth transistor during said burn-in test.

7. The charge pump circuit according to claim 6 wherein said bias circuit comprises:

a plurality of diodes connected in a series; and a sixth transistor connected in a series with said diodes for operating in place of said fifth transistor to set the low-level output voltage of said inverter to a prescribed voltage.

8. A step-up circuit comprising:

a charge pump circuit according to claim 7;

a clock generating circuit for generating said first clock, said second clock, and said third clock, and for outputting each of said clocks to said charge pump circuit;

a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test is received.

9. A step-up circuit comprising:

a charge pump circuit according to claim 6;

a clock generating circuit for generating said first clock, said second clock, and said third clock, and for outputting each of said clocks to said charge pump circuit;

a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test as received.

10. The charge pump circuit according to claim 5, wherein said first leak current suppressing circuit comprises:

a first inverter for inverting a received first clock and outputting to said first step-up capacitor;

a first gate circuit for outputting a clock of the same phase as the output clock of said first inverter during normal operation and halting the output of said clock during a burn-in test; and a fourth step-up capacitor having one end connected to the output of said first gate circuit and the other end connected to the output terminal of said first step-up capacitor; said second leak current suppressing circuit comprises:

a second inverter for inverting a received second clock and outputting to said second step-up capacitor;

a second gate circuit for outputting a clock of the same phase as the output clock of said second inverter during normal operation and halting the output of said clock during a burn-in test; and a fifth step-up capacitor having one end connected to the output of said second gate circuit and the other end connected to the output terminal of said second step-up capacitor; and said third leak current suppressing circuit comprises:

a third inverter for inverting a received third clock and outputting to said third step-up capacitor;

a third gate circuit for outputting a clock of the same phase as the output clock of said third inverter during normal operation and halting the output of said clock during a burn-in test; and a sixth step-up capacitor having one end connected to the output of said third gate circuit and having the other end connected to the output terminal of said third step-up capacitor.

11. A step-up circuit comprising:

a charge pump circuit according to claim 6;

a clock generating circuit for generating said first clock, said second clock, and said third clock, and for outputting each of said clocks to said charge pump circuit;

a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test is received.

12. A step-up circuit comprising:

a charge pump circuit according to claim 5;

a clock generating circuit for generating said first clock, said second clock, and said third clock, and for outputting each of said clocks to said charge pump circuit;

a decision circuit for comparing a prescribed set voltage that is generated based on a reference voltage and said stepped-up voltage, transmitting as a status signal a signal for halting the oscillation of said clock generating circuit if said stepped-up voltage is greater than said set voltage, and transmitting as a status signal a signal for continuing the oscillation of said clock generating circuit if said stepped-up voltage is equal to or lower than said set voltage; and a voltage detecting circuit for detecting the level of said external power supply voltage, and outputting a burn-in mode signal instructing switching to a mode corresponding to a burn-in test when said external power supply voltage is equal to or higher than a prescribed operating voltage, or when a signal instructing the execution of a burn-in test is received.

13. A step-up circuit comprising:

a step-up section for outputting a stepped-up voltage in which the power supply voltage has been stepped up;

a step-up control unit for outputting to said step-up section switching signals of a higher voltage than said stepped-up voltage; and a leak current suppressing means for suppressing the maximum voltage occurring inside said step-up control unit to less than the leak initiation voltage of transistor that make up said step-up control unit.

14. The step-up circuit according to claim 13 wherein:

said leak current suppressing means includes a first operating mode and a second operating mode, and the amplitude ratio of said switching signal with respect to the power supply voltage during said second operating mode is lower than during said first operating mode.

15. The step-up circuit according to claim 14 wherein:

said leak current suppressing means decreases said amplitude ratio by switching the power supply voltage that is supplied to logic gates that make up said leak current suppressing means.

16. The step-up circuit according to claim 14 wherein:

said leak current suppressing means decreases said amplitude ratio by switching amplitude of a clock that is supplied to said leak current suppressing means.

17. The step-up circuit according to claim 13 wherein:

said leak current suppressing means includes a first operating mode and a second operating mode; and the loss ratio of said switching signal during said second operating mode is greater than during said first operating mode.

18. The step-up circuit according to claim 17 wherein:

said leak current suppressing means increases said loss ratio by capacitance-dividing said switching signal.

19. A semiconductor memory device comprising:

a step-up section for outputting a stepped-up voltage in which a power supply voltage is stepped up;

a step-up control unit for outputting to said step-up section switching signals of a higher voltage than said stepped-up voltage;

a leak current suppressing means for suppressing the maximum voltage occurring in said step-up control unit to less than the leak-initiating voltage of first transistors that make up said step-up control unit; and second transistors that make up a memory unit; wherein said first transistors and said second transistors are formed in the same semiconductor substrate or well.

20. A semiconductor memory device comprising:

a step-up section for outputting a stepped-up voltage in which a power supply voltage is stepped up;

a step-up control unit for outputting to said step-up section switching signals of a higher voltage than said stepped-up voltage;

a leak current suppressing means for suppressing the maximum voltage occurring in said step-up control unit to less than a leak-initiating voltage of first transistors that make up said step-up control unit; and second transistors that make up a memory unit; wherein said first transistors are formed in a first well region;

said second transistors are formed in a second well region; and said first well region and said second well region are connected to the same well potential biasing means.

* * * * *